United States Patent
Fujiwara

[11] Patent Number: 5,898,197
[45] Date of Patent: Apr. 27, 1999

[54] NON-VOLATILE SEMICONDUCTOR MEMORY DEVICES

[75] Inventor: Hideaki Fujiwara, Gifu, Japan

[73] Assignee: Sanyo Electric Co., Ltd., Osaka, Japan

[21] Appl. No.: 08/870,122

[22] Filed: Jun. 3, 1997

[30] Foreign Application Priority Data

Jun. 6, 1996 [JP] Japan .................................. 8-144428

[51] Int. Cl.$^6$ .................................................. H01L 29/788
[52] U.S. Cl. ...................... 257/317; 257/314; 257/319; 257/320; 257/321; 365/185.26
[58] Field of Search ................................ 257/317, 314, 257/319, 320, 321; 365/185.26, 185.28

[56] References Cited

U.S. PATENT DOCUMENTS

| | | | |
|---|---|---|---|
| 4,577,215 | 3/1986 | Stewart et al. | 357/23.5 |
| 5,049,956 | 9/1991 | Yoshida et al. | 257/317 |
| 5,111,430 | 5/1992 | Morie | 365/185 |
| 5,194,924 | 3/1993 | Komori et al. | 257/316 |
| 5,464,784 | 11/1995 | Crisenza et al. | 437/43 |
| 5,554,869 | 9/1996 | Chang | 257/316 |
| 5,757,044 | 5/1998 | Kubota | 257/317 |

FOREIGN PATENT DOCUMENTS 52-13782  2/1977  Japan .
61-216482  9/1986  Japan .

OTHER PUBLICATIONS

"Flash Memory Engineering Handbook", pp. 106–131 (Aug. 15, 1993).
Kure et al., "Dry Etching of Single Crystal Silicon", pp. 31–37 (1979).
Ahn et al., "Micro Villus Patterning (MVP) Technology for 256Mb DRAM Stack Cell", 1992 Symposium on VLSI Technology Digest of Technical Papers, pp. 12–13 (1992).
Terada et al., "COB Structure and HSG Silicon Storage Electrode", Latest Semiconductor Process Technology pp. 71–76 (1992).
U.S. Patent Application Serial No. 08/649,176 filed May 17, 1996 claiming priority from Japanese Patent Application No. 7–120128 dated May 18, 1995 and Japanese Patent Application No. 8–100011 dated Apr. 22, 1996.

*Primary Examiner*—J. Carroll
*Attorney, Agent, or Firm*—Sheridan Ross P.C.

[57] ABSTRACT

A non-volatile semiconductor memory device accurately stores multivalued data with reduced damage to an insulating layer. The non-volatile semiconductor memory device includes a floating gate electrode configured to be divided into at least two portions. The first portion is employed for accumulating carriers migrating from at least one control gate electrode through a gate insulating layer to the floating gate electrode.

34 Claims, 13 Drawing Sheets

| Operation | Write | Erase | Read |
|---|---|---|---|
| Control gate electrode 207 | +12V | 0V | +5V |
| Drain area 202b | 0V | +12V | +5V |
| Source area 202a | +5V | OPEN | 0V |
| Substrate 201 | 0V | 0V | 0V |

NON-VOLATILE SEMICONDUCTOR MEMORY DEVICES

BACKGROUND OF THE INVENTION

1. Field of the Invention

The present invention relates generally to a non-volatile semiconductor memory device and particularly to a non-volatile semiconductor memory device suitable for storing multivalued data.

2. Description of the Related Art

Recently, Erasable and Programmable ROMs (EPROMs) and Electrically Erasable and Programmable ROMs (EEPROMs), which can substitute for magnetic memories including hard disks, and floppy disks, are drawing attention. EPROMs and EEPROMS each have a plurality of memory cells (memory cell transistors). Each memory cell has a floating gate electrode for storing a carrier and control gate for detecting the threshold voltage, which changes depending on the presence and absence of the carriers accumulated in the floating gate electrode. EEPROMs include flash EEPROMs, which can perform data erasure for all the memory cells or partial data erasure for each array of block memory cells.

In each memory cell, a first gate insulating layer is provided between the floating gate electrode and a channel area, and a carrier is implanted from the channel area into the floating gate electrode through the first gate insulating layer. The carrier is implanted according to any of the following methods:

1) by generating hot carriers in the channel area (channel hot carrier); and
2) causing the flow of a Fowler-Nordheim (FN) tunnel current between the floating gate electrode and the channel area.

An increase in the carrier implantation energy increases damage to the first gate insulating layer. Such serious damage to the first gate insulating layer allows formation of charge trap. The charge trap causes a change in the I-V characteristics, that is, the relationship between the current flowing through a memory cell and the control gate voltage. As a results the threshold voltage of the memory cell is changed. This makes accurate writing and reading of data impossible.

The damage to the first gate insulating film limits the number of feasible data rewrites for the memory cell, In other words, the first gate insulating layer is damaged each time carriers are implanted into the floating gate electrode. If the degree of damage exceeds a certain level, insulatability of the first gate insulating layer is lowered to permit leakage of the carrier accumulated in the floating gate electrode. In this state, the memory cells no longer function properly.

In order to increase the number of feasible data rewrites, carrier preferably has a smallest possible implantation energy. The thinner the first gate insulating layer is, the smaller the carrier implantation energy can be. However, an extremely small film thickness increases leakage of the carrier from the floating gate electrode, and thus the data retention time in the memory cell becomes short. Accordingly, when data retention time is taken into consideration, it is not preferred to allow the first insulating layer to have a small thickness.

The method of extracting the carrier from the floating gate electrode differs depending upon the following two types:

1) Two-layer polysilicon type: An FN tunnel current is flowed between the channel area or source/drain area and the floating gate electrode through the first gate insulating layer; and
2) Three-layer polysilicon type: A second gate insulating layer is provided between the floating gate electrode and the control gate electrode, and an FN tunnel current is flowed between the floating gate electrode and the control gate electrode through the second gate insulating layer.

In the two-layer polysilicon type, damage to the first gate insulating layer is caused when the carriers are extracted. In the three-layer polysilicon type, damage to the second gate insulating layer but not to the first gate insulating layer is caused when the carriers are extracted. The adverse influence of the damage in the second gate insulating layer is smaller than that of the first gate insulating layer. *Flash Memory Engineering Handbook* (published by Science Forum) describes in detail the structures of memory cells in EEPROMs and EPROMs and damage to gate insulating layers.

FIG. 1 shows schematically a cross-sectional view of an example of a conventional stacked gate type memory cell generally employed in a flash EEPROM. The stacked gate type memory cell consists of a single crystal silicon substrate 201 with a source area 202a, a drain area 202b and a channel area 203, which is defined between the former two areas 202a and 202b, all being defined on the surface of the substrate 201. The stacked gate type memory cell further includes a gate insulating layer 204, a floating gate electrode 205, a gate insulating layer 206 and a control gate electrode 207, which are laminated successively on the channel area 203 in that order. The layers 204 to 207 have the same dimensions in the horizontal directions. Accordingly, the control gate electrode 207 is laminated exactly on the floating gate electrode 205 without dislocation. Further, the source area 202a and the drain area 202b are defined symmetrically on each side of the gate electrodes 205, 207 and channel area 203.

With respect to the terms "source area" and "drain area" in a memory cell used herein, provided that the reading operation is determined as the basic operation, the area to which a high voltage is applied in the reading operation is referred to as the drain area; whereas the area to which a low voltage is applied is referred to as the source area. These terms shall also apply in the writing operation and in the erasing operation.

Next, operations (writing, reading and erasing operations) of the stacked gate type memory cells will be described referring to FIG. 2. In any of these operations, a voltage maintained at the ground level (0 V) is applied to the substrate 201.

(a) Writing Operation;

In the writing operation, voltages of +12 V, 0 V and 5 V are applied to the control gate electrode 207, the drain area 202b and the source area 202a respectively. Thus, the potential of the floating gate 205 is elevated by the capacitive coupling between the floating gate electrode 205 and the control gate electrode 207. Further, channel hot electrons generated in the channel area 203 near the source area 20a are implanted into the floating gate electrode 205. Consequently, electrons are accumulated in the floating gate electrode 205, and one-bit data is written and stored therein.

(b) Reading Operation:

In the reading operation, a voltage of +5 V is applied to the control gate electrode 207 and to the drain area 202b, and a voltage of 0 V is applied to the source area 202a. Thus, the cell current flowing from the drain area 202b to the source area 202a in the memory cell assuming the written state becomes smaller than the current flowing through a memory cell assuming the erased state. This is because the channel area 203 is turned off since hot electrons are implanted into the floating gate electrode 205 in the memory cell assuming the written state, and the channel area 203 in the memory cell assuming the erased state is turned on. The values of cell current flowing through those memory cells are determined, and, for example, a value of written data "1" and a value of erased data "0" can be read depending on the thus determined cell current values.

(c) Erasing Operation:

In the erasing operation, voltages of 0 V and +12 V are applied to the control gate electrode 207 and to the drain area 202b, respectively, and the source area 202a is set to assume an open state. Then, an FN tunnel current flows from the drain area 202b to the floating gate electrode 205, and the electrons accumulated in the floating gate electrode are extracted into the drain area 202b. Thus, the data stored in the memory cell is erased.

In order to improve the integration degree of the semiconductor memory, a multivalued data memory device is proposed. In this memory device, one memory cell can be allowed to store multivalued data of three values or more instead of binary data (erased state and written state), or one-bit data.

FIG. 3 is a characteristic graph showing a relationship between the value Id of cell current flowing through the stacked gate type memory cell and the potential Vfg of the floating gate electrode 205 in a memory cell. In FIG. 3, the floating gate potential Vfg indicates the potential of the floating gate electrode 205 with respect to the source area 202a.

As shown in this graph, when the floating gate potential Vfg is less than the threshold voltage Vth (approx. +1 V), the cell current value Id indicates zero. When the floating gate potential Vfg exceeds the threshold voltage Vth, the cell current value Id and the floating gate potential Vfg assume a directly proportional relationship.

The floating gate potential Vfg can be expressed by the following equation:

$$Vfg=Vfgw+Vfgc$$

wherein Vfgw is the potential generated by the electrons accumulated in the floating gate electrode 205 in the writing operation, and Vfgc is the potential to be generated by the capacitive coupling with the source area 202a. In the reading operation, since the potential Vfgc is fixed, the cell current value Id is determined essentially by the potential Vfgw. In the writing operation, the charge quantity of the floating gate electrode 205, i.e., the potential Vfgw, can be controlled by adjusting the writing operation time. This control of the floating gate potential Vfg allows desired setting of the cell current value Id in the reading operation.

For example, as shown in FIG. 3, assume that data values "11", "10", "01" and "00" correspond to the areas having cell current values Id of less than 40 μA, 40 μA or more and less then 80 μA, 80 μA or more and less than 120 μA, and 120 μA or more and less than 160 μA, respectively. In this case, in the writing operation, the time of the writing operation is adjusted so that floating gate potentials Va, Vb, Vc and Vd corresponding to the cell current values Id (40, 80, 120 and 160 μA) may be obtained. Thus, four-value (two bit) data can be stored in one memory cell.

However, in the erasing operation, when electrons are excessively extracted from the floating gate electrode 205, the channel area 203 is turned on even if a predetermined voltage (0 V) is applied to the control gate electrode 207 so as to maintain the memory cell in the OFF state. Consequently, the memory cell is constantly allowed to assume the ON state, giving rise to a problem of excessive erasure where a cell current flows even if the memory cell is in the stand-by state, Accordingly, it is not desired to use such area since it can cause excessive erasure of data storage.

In the reading operation, the potential of the floating gate electrode 205 is also determined according to the equation Vfg=Vfgw+Vfgc. In the reading operation, the area where the condition Vfg−Vfgc=Vfgw>Vth is established causes an excessive erasure when the potential Vfg of the floating gate electrode 205 is elevated to +5 V by the capacitive coupling with the control gate electrode 207. In this case, the area having a floating gate potential Vfg of +6 V or more causes an excessive erasure.

Further, since the cell current value Id assumes substantially a constant value when the floating gate potential Vfg is less than 1 V, the cell current value Id cannot be allowed to assume a plurality of data values depending on the value Id correspondingly. In order to prevent writing errors and reading errors from occurring in a multivalued semiconductor memory device, it is preferred that the range of the floating gate potential and that of the cell current value Id corresponding to the respective values of multivalued data have sufficient margins. However, in a flash EEPROM employing stacked gate type memory cells, the range of cell current values suitable for storing multivalued data is limited to the area where the electric current fluctuates a lot due to the reasons described above, and no excessive erasure occurs. Accordingly, it is difficult to achieve sufficient margins for the floating gate potentials Vfg and the cell current values Id corresponding to the multivalued data values.

Since the range corresponding to the data values of the floating gate potential Vfg is relatively narrow, it is difficult to achieve a sufficient margin in the writing operation for accurately setting the floating gate potential Vfg. Further, since the range corresponding to the respective data values of cell current value Id is relatively narrow, it is difficult to achieve sufficient margin in the reading operation for accurately reading the cell current value Id. The achievement of sufficient margins becomes further difficult in an 8-value or 16-value system compared with the 4-value system, because the range corresponding to the multivalued data values of the floating gate electrode Vfg and of the cell current value Id are further narrowed.

SUMMARY OF THE INVENTION

Broadly speaking, the present invention relates to a non-volatile semiconductor memory device which stores accurately multivalued data with reduced damage to the insulating layer. The present invention can be implemented in numerous ways, including as an apparatus and method.

In one aspect of the invention, a non-volatile semiconductor memory device includes: a semiconductor layer; a source area and a drain area, which are defined on the semiconductor layer, with a channel area being defined between the source area and the drain area; a first gate insulating layer located on the channel area; a floating gate electrode located on the first gate insulating layer; a second gate insulating layer located on the floating gate electrode; and at least one control gate electrode located on the second gate insulating layer. The floating gate electrode is configured to be divided into at least two portions. The first portion is employed for accumulating carriers migrating from the at least one control gate electrode through the second gate insulating layer to the floating gate electrode.

In another aspect of the invention, a non-volatile semiconductor memory device includes: a semiconductor layer; a source area and a drain area, which are defined on the semiconductor layer, with a channel area being defined between the source area and the drain area; a first gate insulating layer located on the channel area; a floating gate electrode located on the first gate insulating layer; a second gate insulating layer located on the floating gate electrode; a first control gate electrode located on the second gate insulating layer; a third gate insulating layer located on the first control gate electrode; and a second control gate electrode located on the third gate insulating layer. The floating gate electrode is configured to be divided into at least two portions. The first and second control gate electrodes are employed for generating hot carriers migrating from the first control gate electrode through the second gate insulating layer to the floating gate electrode. The hot carriers have a relatively small energy and are generated by applying a predetermined voltage to the first and second control gate electrodes. The first portion is employed for accumulating the hot carriers. The amount of hot carriers to be accumulated in the first portion is adjusted depending on a data value.

In yet another aspect of the invention, a non-volatile semiconductor memory device includes: a semiconductor layer; a source area and a drain area, which are defined on the semiconductor layer, with a channel area being defined between the source area and the drain area; a first gate insulating layer located on the channel area; a floating gate electrode located on the first gate insulating layer: a second gate insulating layer located on the floating gate electrode; a semiconductor gate electrode located on the second gate insulating layer; a third gate insulating layer located on the first control gate electrode; and a metallic gate electrode located on the third gate insulating layer. The floating gate electrode is configured to be divided into at least two portions, The semiconductor and metallic gate electrodes are employed for generating hot carriers migrating from the semiconductor gate electrode through the second gate insulating layer to the floating gate electrode. The hot carriers have a relatively small energy and are generated by applying a predetermined voltage to the semiconductor and metallic gate electrodes. The first portion is employed for accumulating the hot carriers. The amount of hot carriers to be accumulated in the first portion is adjusted depending on a data value.

In another aspect of the invention, a non-volatile semiconductor memory device includes: a semiconductor layer having a first conductivity; two first semiconductor areas defined on the semiconductor layer and having a second conductivity; a pillar formed to extend perpendicular from the semiconductor layer, the pillar including a second semiconductor area defined at the upper portion of the pillar, a channel area defined between the two first semiconductor areas and the second semiconductor area, and two side walls, the second semiconductor area having the second conductivity; two first gate insulating layers respectively located on the two walls of the pillar; two floating gate electrodes respectively located on the two first gate insulating layers: two second gate insulating layers respectively located on the two floating gate electrodes; two first control gate electrodes respectively located on the two second gate insulating layers; two third gate insulating layers respectively located on the two first control gate electrodes; and two second control gate electrodes respectively located on the two third gate insulating layers. Each the floating gate electrode is configured to be divided into at least two portions. A pair of the first and second control gate electrodes is employed for generating hot carriers migrating from the first control gate electrode through the second gate insulating layer to the floating gate electrode. The hot carriers have a relatively small energy and are generated by applying a predetermined voltage to the pair of the first and second control gate electrodes. The first portion is employed for accumulating the hot carriers. The amount of hot carriers to be accumulated in the first portion is adjusted depending on a data value.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings, in which.

DETAILED DESCRIPTION OF THE PREFERRED EMBODIMENTS

First Embodiment

Figures 1, 2:
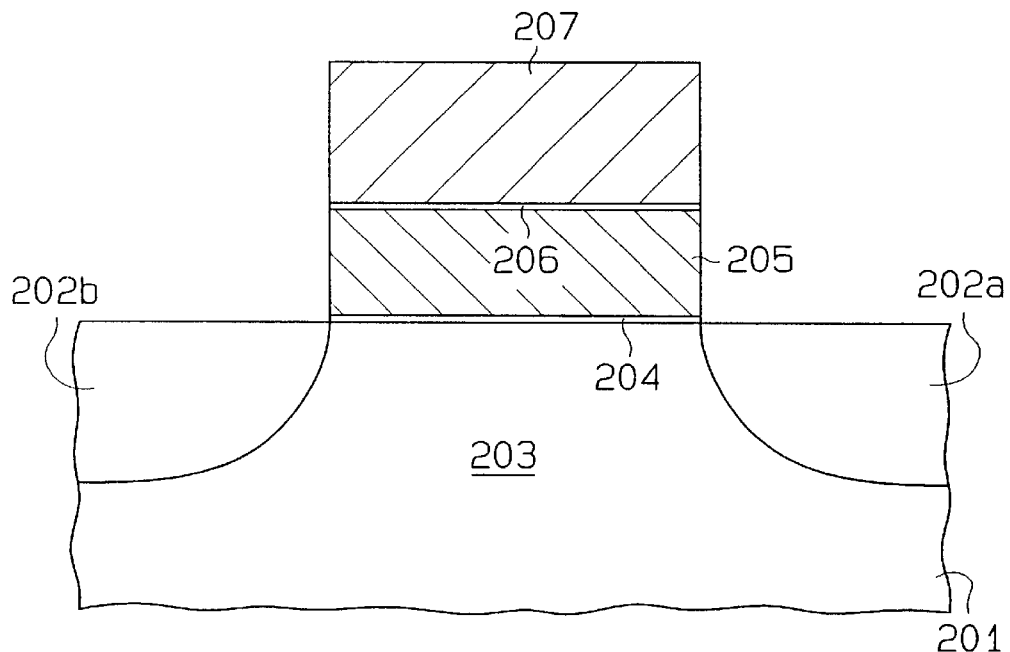
FIG. 1 is a schematic cross-sectional view showing an example of a stacked gate type memory cell generally employed in a conventional flash EEPROM.
FIG. 2 shows operation voltages of the memory cell shown in FIG. 1 in various operations.
Figure 3:
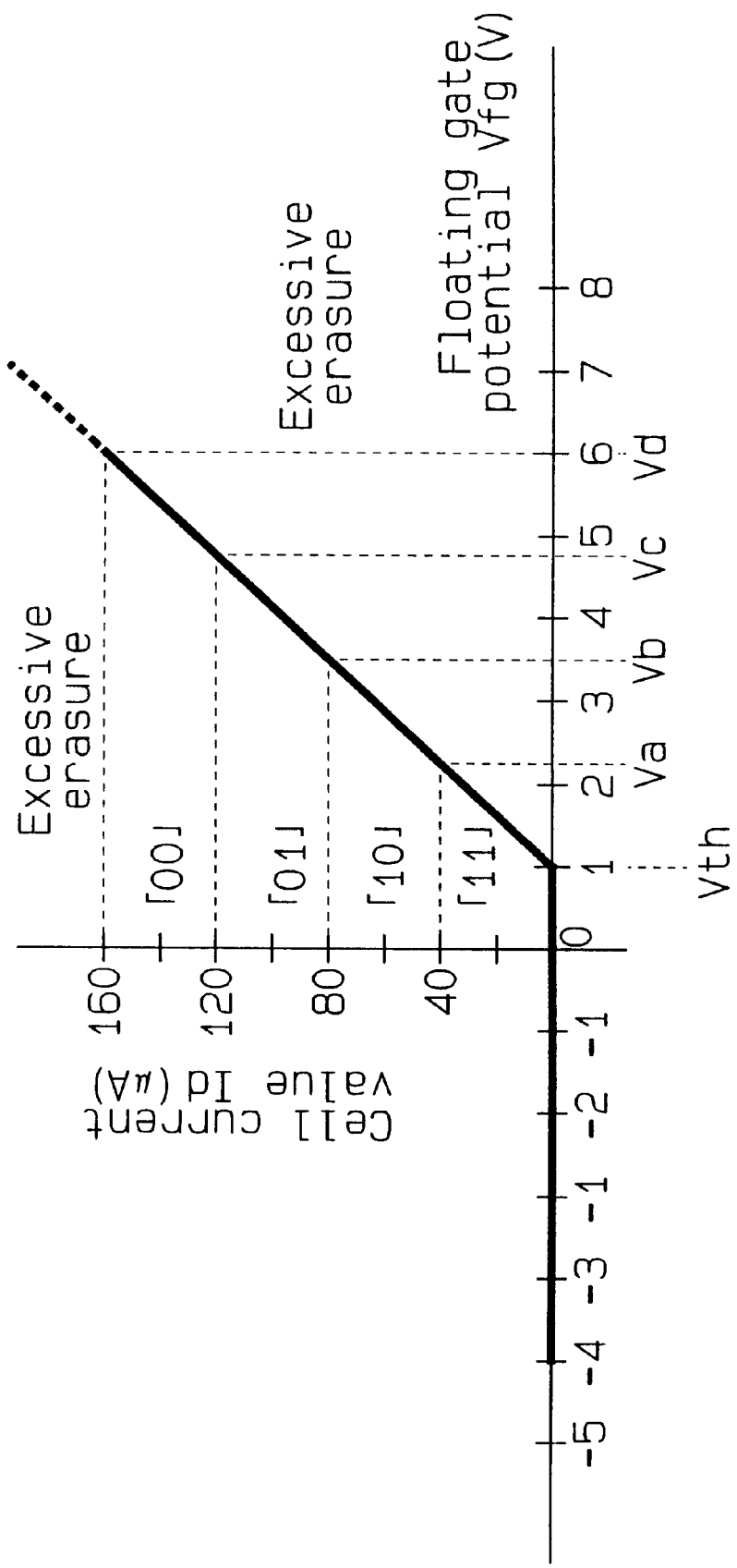
FIG. 3 is a characteristic graph showing a relationship between the value of cell current flowing through the memory cell shown in FIG. 1 and the potential of the floating gate electrode in the memory cell.
Figure 4:
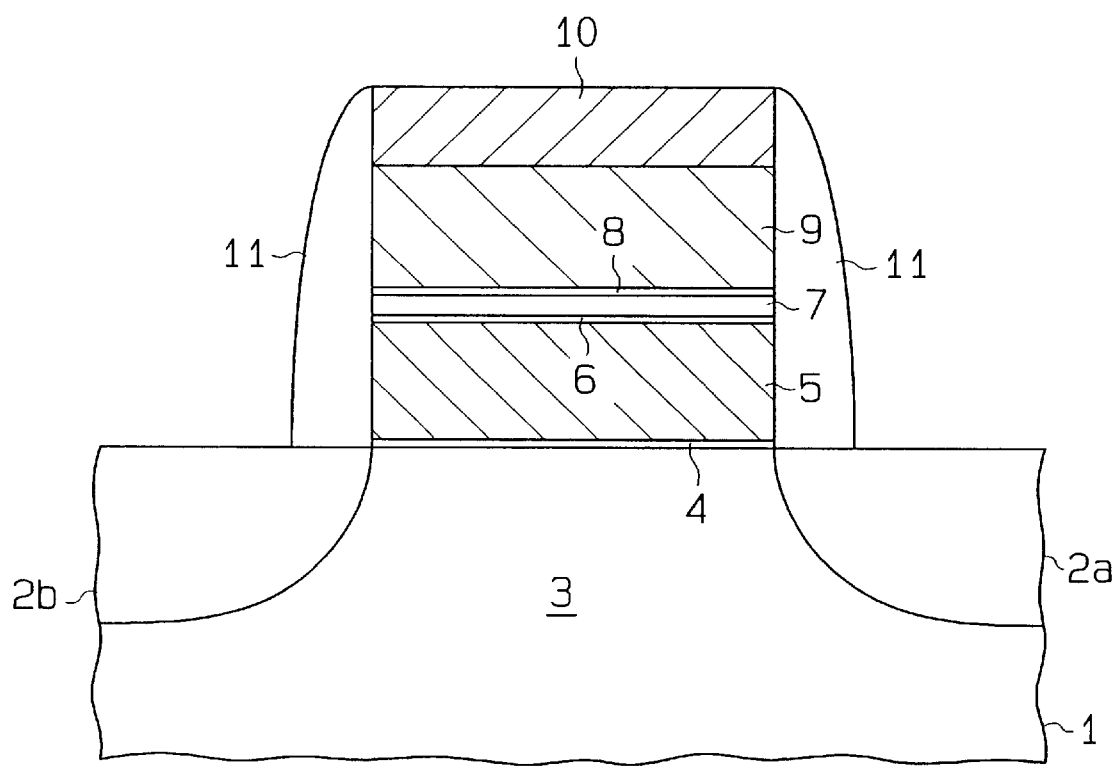
FIG. 4 is a schematic cross-sectional view showing a memory cell of a non-volatile semiconductor memory device according to a first embodiment of the invention.

A non-volatile semiconductor device according to a first embodiment of the invention will be described referring to the attached drawings. FIG. 4 is a schematic cross-sectional view showing a memory cell of a non-volatile semiconductor memory device according to the first embodiment of the invention. The memory cell has a p-type single crystal silicon substrate 1, an n-type source area 2a and an n-type drain area 2b both defined on the surface of the substrate 1, and a channel area 3 formed between the source area 2a and the drain area 2b. The memory cell further has a gate oxide layer 4 (film thickness; about 10 nm), a floating gate electrode 5 (film thickness: about 200 nm), a gate oxide layer 6 (film thickness: about 10 nm), a first control gate electrode 7 (film thickness: about 20 nm), a gate oxide layer 8 (film thickness: about 3 nm), a second control gate electrode 9 (film thickness: about 200 nm) and an insulating layer 10 (film thickness: about 100 nm), which are laminated successively on the channel area 3 in that order. In other words, the memory cell of the first embodiment has a three-layer structure gate electrode consisting of the floating gate electrode 5, the first control gate electrode 7 and the second control gate electrode 9. The gate oxide layer 4 is located between the channel area 3 and the floating gate electrode 5. The gate oxide layer 6 is located between the floating gate electrode 5 and the first control gate electrode 7. The gate oxide layer 8 is located between the first control gate electrode 7 and the second control gate electrode 9. The gate oxide layers 4, 6 and 8 may be insulating films such as of silicon oxide, silicon nitride and silicate glass or may be formed by laminating such insulating films.

While the layers 4 to 10 have different film thicknesses, they have the same dimensions in the horizontal directions. Accordingly, the source area 2a and the drain area 2b are arranged symmetrically on each side of the gate electrodes 5, 7 and 9 and channel area 3. The layers 4 to 10, each have a substantially uniform film thickness. Both lateral faces of the layers 4 to 10 constitute side walls. The memory cell further has insulating side wall spacers 11 formed on these side walls.

Figure 5A:
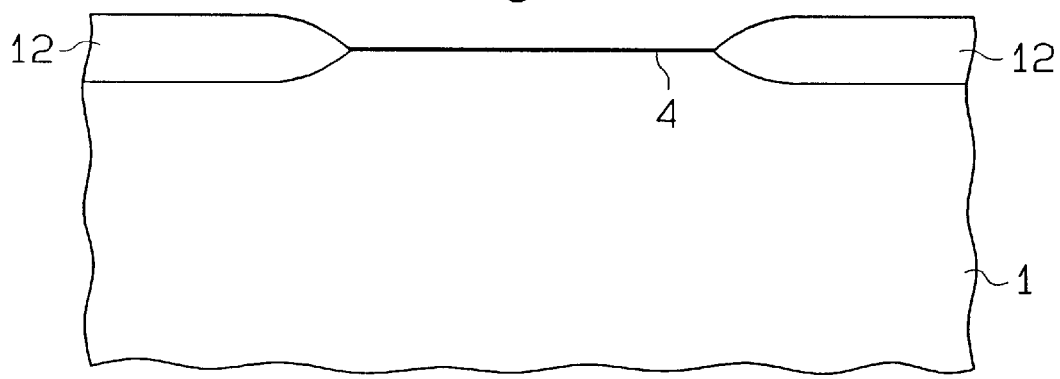
FIGS. 5A to 5C are schematic cross-sectional views showing a process for producing the memory cell shown in FIG. 4.

The floating gate electrode 5 is formed of columnar conductive microcrystals (hereinafter referred to as columnar crystals) oriented to extend in a direction perpendicularly to the surface of the gate oxide layer 4. The columnar crystals have gaps between them, and these gaps are packed with an insulating material to electrically insulate adjoining columnar crystals from one another. In order to enable external setting of voltages to be applied to the first and second control gate electrodes 7 and 9, the first and second control gate electrodes 7 and 9 are connected to wirings (not shown) to which predetermined voltages are applied, respectively, Next, a process for producing the memory cell of the first embodiment will be described referring to FIGS. 5A to 7. Step 1 (see FIG. 5A):

A field oxide film 12 is formed partially on the surface of a p-type single crystal silicon substrate 1 according to the Local Oxidation on Silicon (LOCOS) process. Next, a gate oxide tile 4 is formed on the rest of the surface of the substrate 1 by heat oxidation. The single crystal silicon substrate may be replaced with a semiconductor layer including a well or wells, a single crystal silicon film, a polysilicon film and an amorphous silicon film.

Figure 5B:
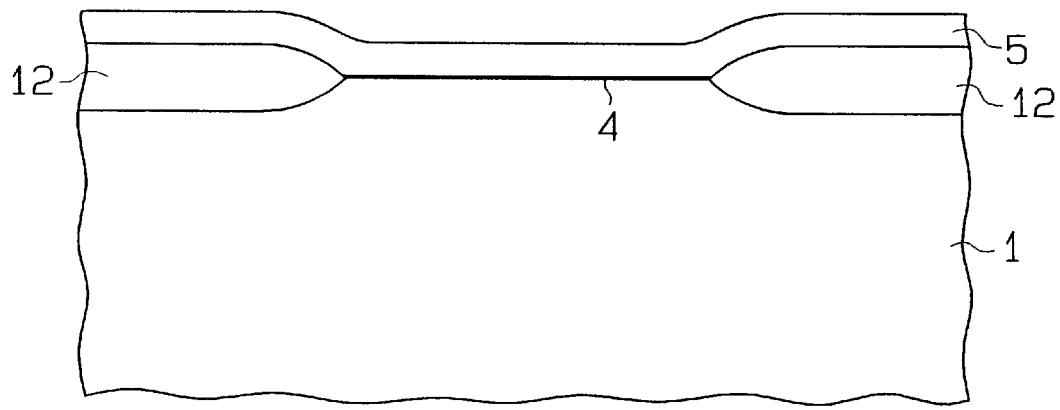
Figure 5C:
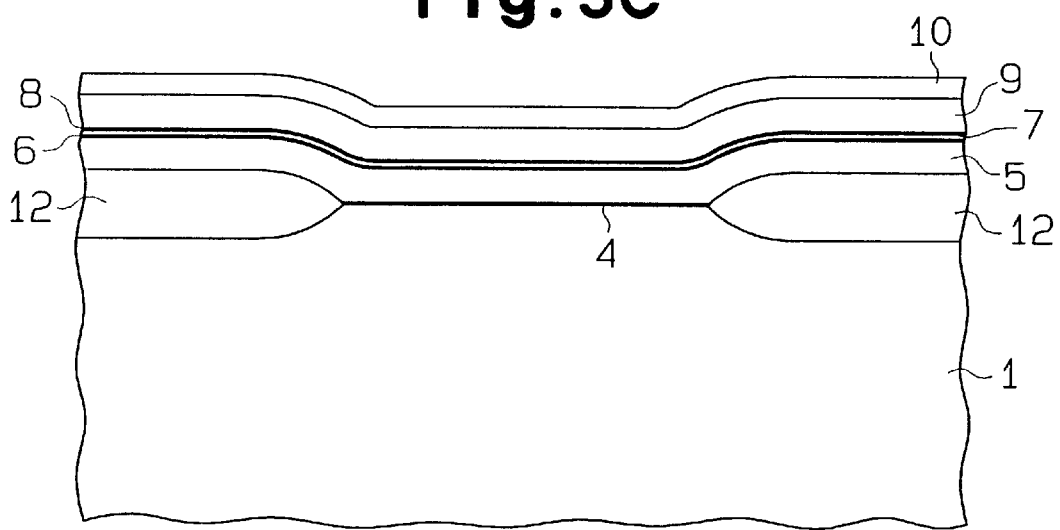
Figure 6:
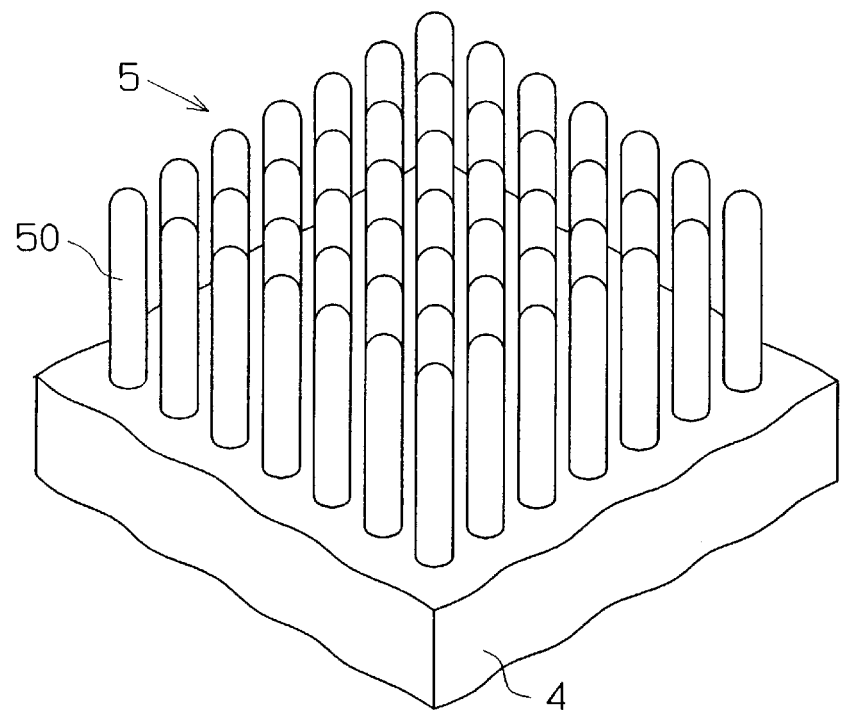
FIG. 6 is a schematic drawing showing the floating gate electrode in the memory cell shown in FIG. 4.
Figure 7:
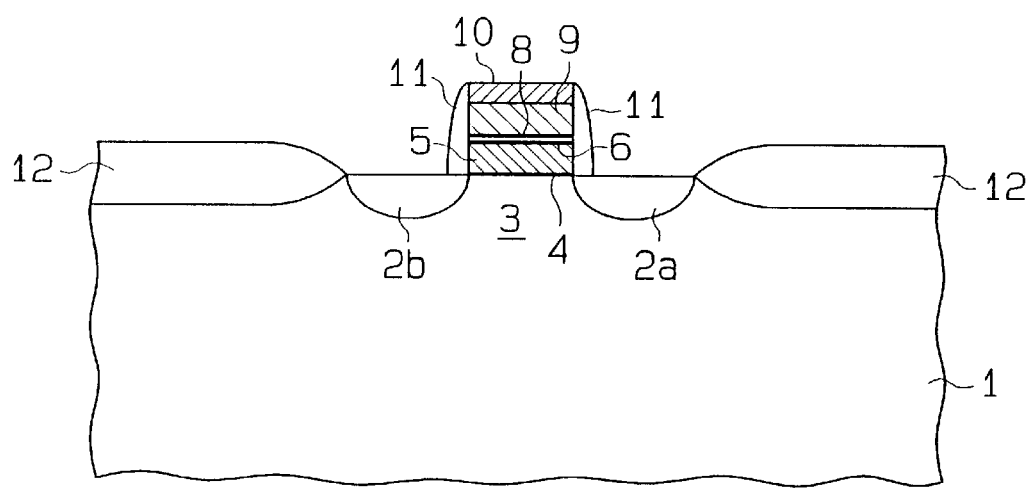
FIG. 7 is a schematic cross-sectional view showing a process for producing the memory cell shown in FIG. 4.

Step 2 (see FIG. 5B):

A film 5 for forming a floating gate electrode is formed on the surfaces of the field oxide film 12 and of the gate oxide film 4. Incidentally, in FIGS. 5E and 5C, the film and the floating gate electrode are affixed with the same reference number 5. FIG. 6 shows a film 5 containing a plurality of columnar crystals 50 oriented to extend perpendicularly from the surface of the gate oxide film 4. In FIG. 5B, the gaps between the columnar crystals 50 are not yet packed with the insulating material, The process for forming the columnar crystals will be described later in detail.

Step 3 (see FIG. 5C):

A gate oxide film 6, a doped polysilicon film 7 for forming a control gate electrode, a gate oxide film 8, a doped polysilicon film 9 for forming a control gate electrode and a silicon oxide film 10 for forming an insulating film are laminated successively on the surface of the film 5 in that order by means of Chemical Vapor Deposition (CVD). In FIG. 5C, the doped polysilicon film and the first control gate electrode are affixed with the same reference number 7, whereas the doped polysilicon film and the second control gate electrode are affixed with the same reference number 9.

Step 4 (see FIG. 7):

The films 4 to 10 are subjected to patterning by means of anisotropic etching to define a gate oxide layer 4, a floating gate electrode 5, a gate oxide layer 6, a first control gate electrode 7, a gate oxide layer 8, a second control gate electrode 9 and an insulating layer 10. Next, an n-type impurity ion (phosphorus, arsenic, etc.) is implanted to the surface of the substrate 1 to define a source area 2a and a drain area 2b. Then, an insulating film is formed over the entire surface of the resulting device, followed by patterning of the insulating film by means of full etching back to form side well spacers 11.

Subsequently, a layer insulating film (not shown) is formed over the entire surface of the device, and contact holes communicating respectively with the source area 2a and to the drain area 2b are formed in the layer insulating film . Further, contact holes communicating with the first and second control gate electrodes 7 and 9 are formed in the layer insulating film, Next, a conductive material film is formed over the entire surface of the device and in these contact holes. The conductive material film is subjected to patterning to form a source electrode (not shown), a drain electrode (not shown), and wirings (not shown) connected to the first and second control gate electrodes 7 and 9.

In Step 4, arsenic ions may be implanted over the entire surface of the device after formation of the side wall spacers 11 under the following implantation conditions: energy: 50 keV; dose: $5 \times 10^{-15}$ cm$^{-2}$.

Next, a process for forming the columnar crystals shown in FIG. 6 will be described. Four methods will be described below,

[Method 1]:

A doped polysilicon film is formed on the surface of the gate oxide film 4 by means of CVD. When the doped polysilicon film is formed, the temperature is set to about 620° C. Thus, a doped polysilicon film consisting of columnar crystals are deposited on the surface of the film 4. Next, the doped polysilicon film is subjected to wet etching using a solution such as a phosphoric acid type solution or KOH to form gaps between the columnar crystals. The wet etching may be replaced with dry etching. The dry etching is preferably performed under a substantially isotropic condition and a less anisotropic condition. Subsequently, a silicon oxide film is formed on the surface of each columnar crystal by means of heat oxidation. The gaps present between the columnar crystals are packed with an insulating material (such as silicon oxide, silicon nitride and a nitride film) by means of CVD. The gaps may be packed with the insulating material (such as silicon oxides silicon nitride and a nitride film) without formation of the silicon oxide film on the surface of each columnar crystal.

[Method 2]:

Titanium particles are deposited on the surface of the gate oxide film 4 by means of sputtering. It is preferred here to deposit the titanium particles such that a uniform density is obtained and that gaps are located between the particles to some extent. Next, tungsten is deposited over the gate oxide film 4 utilizing the titanium particles as seeds by means of selective tungsten CVD. The thus deposited tungsten constitutes columnar crystals. Adjustment of the density of the titanium particles enables adjustment of the size (thickness) of the columnar crystals.

Subsequently, the tungsten is subjected to wet etching using a solution such as of KOH and SCl to separate the columnar crystals from one another so as to form very small gaps between them. The wet etching may be replaced with dry etching. The thus formed gaps between the columnar crystals are packed with an insulating material (such as silicon oxide, silicon nitride and a nitride film) by means of CVD.

Since titanium has excellent adhesion for silicon oxide film, the titanium particles are securely deposited on the surface of the gate oxide film 4. The selective tungsten CVD process is the most effective process for promoting deposition of tungsten utilizing titanium particles as seeds. However, the titanium particles may be replaced with particles of silicon or the like, which can be suitably used as seeds (nuclei) for depositing tungsten in the selective tungsten CVD process and have excellent adhesion for the gate oxide film 4. When a particulate silicon is employed, it is preferably deposited on the surface of the gate oxide film 4 by means of CVD for a short time in place of sputtering.

[Method 3]:

A doped polysilicon film is formed on the surface of the gate oxide film 4 by means of CVD. Next, the doped polysilicon film is subjected to anisotropic etching using a known reactive ion etching (RIE) apparatus under the following conditions: kind of gas and gas flow ratio: $CCl_4/O_2$= 100/20; electric power density: 0.24 W/cm$^2$; pressure: 13 Pa. Microparticles of silicon dioxide present in the plasma are deposited on the surface of the doped polysilicon film by this anisotropic etching. Simultaneously, the surface of the doped polysilicon film is oxidized in mottle. Thus, a silicon oxide film having a multiplicity of holes is formed on the surface of the doped polysilicon film. The thus formed silicon oxide film serves as an etching mask for the anisotropic etching, and, as the result of anisotropic etching of the doped polysilicon film, only columnar residues are left on the surface of the gate oxide film 4. The columnar residues constitute columnar crystals. Adjustment of the etching time enables adjustment of the size (thickness) of the columnar crystals. The process for forming columnar crystals employing a reactive ion etching apparatus was proposed by Kure et al. Details of this process are described in *Process of 1st Dry Process Symposium*, p.31, 1979.

Next, the columnar crystals are subjected to wet etching using a solution such as a phosphoric acid type solution and KOH to separate the columnar crystals from one another so as to form very small gaps between them. Subsequently, a silicon oxide film is formed on the surface of each columnar crystal by means of heat oxidation, and then the gaps between the columnar crystals are packed with an insulating material such as silicon oxide, silicon nitride and a nitride film.

[Method 4]:

Step 1: A doped polysilicon film is formed on the surface of the gate oxide film 4 by means of CVD. Next, a silicon oxide film is formed on the surface of the doped polysilicon film by means of heat oxidation.

Step 2: An amorphous silicon film is formed on the surface of the doped polysilicon film by means of a Low Pressure CVD (LPCVD) method under the following conditions: raw material: disilane gas; temperature: 500° C.; pressure: 0.25 Torr. Next, the amorphous silicon film is subjected to heat treatment at 610° C. for one hour to form hemispherical grain (HSG) silicon. Adjustment of the LPCVD treatment time enables adjustment of the ratio of the surface area of the HSG silicon to that of the doped polysilicon film.

Step 3: The silicon oxide film formed on the doped polysilicon film is subjected to anisotropic etching using the HSG silicon as a mask and employing a reactive ion etching apparatus under the following conditions: kind of gas and gas flow ratio: $CHF_3/CF_4/Ar$=20/20/400; electric power density: 1.7 W/cm$^2$: pressure 250 mTorr. A multiplicity of holes are formed in the silicon oxide film by undergoing this step.

Step 4: The doped polysilicon film is subjected to anisotropic etching using the residue of the silicon oxide film remaining thereon after Step 3 as a mask and employing the reactive ion etching apparatus under the following conditions; kind of gas and gas flow rate: $HBr/Cl_2/O_2$=25/35/4; power density: 1.4 W/cm$^2$: pressure 100 mTorr. Since the silicon oxide film serves as a mask, the doped polysilicon film is anisotropically etched to leave columnar residues only, These columnar residues constitute columnar crystals. The process for forming columnar crystals from the doped polysilicon film utilizing the HSG silicon was proposed by J. H. Ahn, Y. W. Park, et al. This process is described in detail in 1992 *Symposium on VLSI Technology Digest of Technical Papers*, P. 12, 1992.

Step 2 may be replaced with the following step. An HSG silicon is formed on the surface of the doped polysilicon film by means of LPCVD under the following conditions: raw material: helium-diluted 20% silane gas; temperature: 550° C.; pressure: 1 Torr. According to this method, the HSG silicon is formed directly on the surface of the doped polysilicon film. However, the temperature must be controlled accurately. This method is proposed by Terada, Kasai, et al. This method is described in detail in '92 *Saishin Handotai Purosesu Gijyutsu* ('92 Latest Semiconductor Process Technology), published by Press Journal, p.71, COB Kozo to HSG Silicon Chikuseki-denkyoku (COB Structure and HSG Silicon Storage Electrode".

Next, the thus formed columnar crystals are subjected to wet etching using a solution such as a phosphoric acid type solution and KOH to separate the columnar crystals from one another so as to form gaps between them. The wet etching may be replaced with dry etching. Subsequently, a silicon oxide film is formed on the surface of each columnar crystal by means of heat oxidation, The gaps between the columnar crystals are packed with an insulating material such as silicon oxide, silicon nitride and nitride film by means of CVD.

Next, operations of the memory cell according to the first embodiment (writing operation, reading operation and erasing operation) will be described. In any of these operations, a ground level voltage (0 V) is applied to the substrate 1.

(a) Writing Operation

Figure 8A:
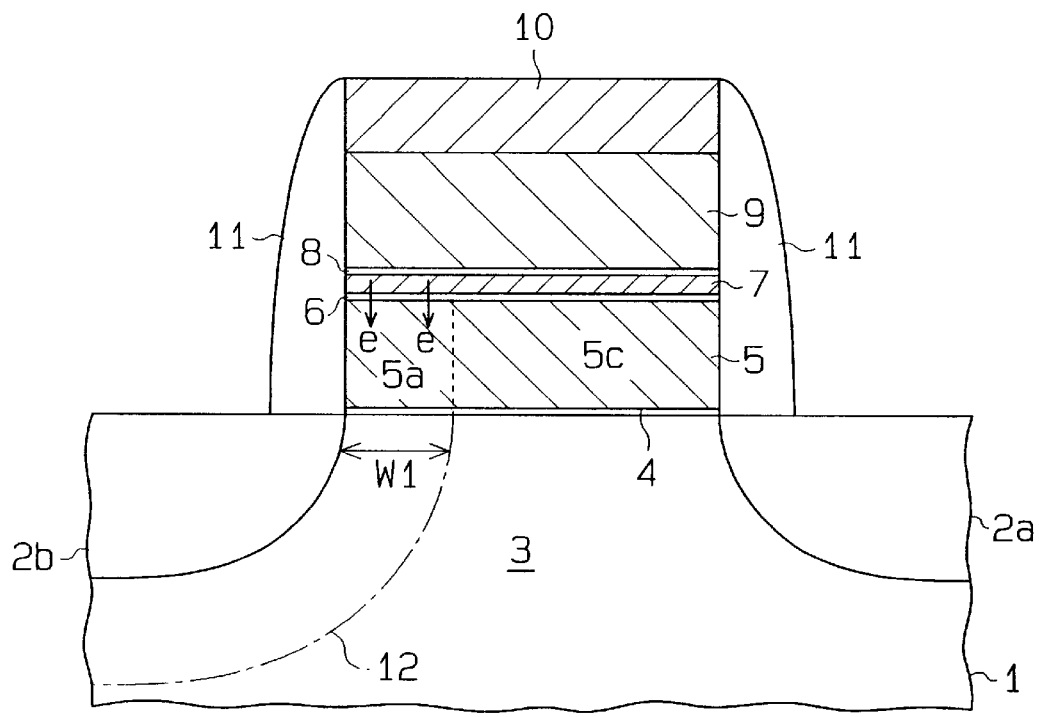
FIGS. 8A and 8B are schematic cross-sectional views illustrating writing operations of the memory cell according to the first embodiment.
Figure 8B:
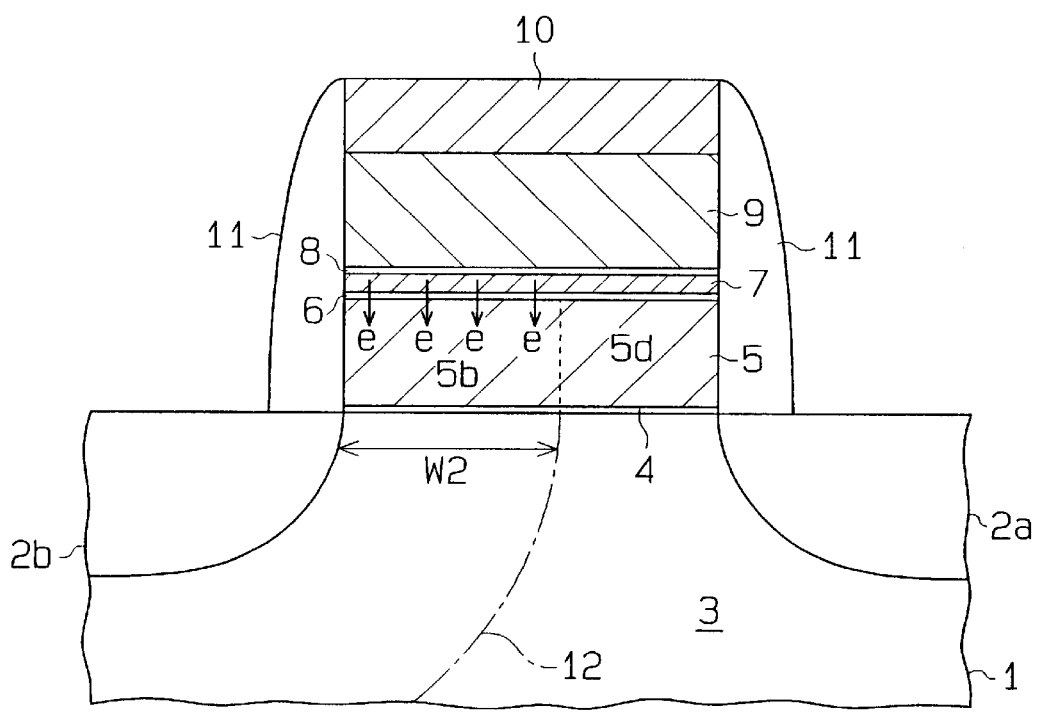

In the writing operation, hot electrons are implanted in the floating gate electrode 5 when an FN tunnel current is flowed from the floating gate electrode 5 to the control gate electrode 7. More specifically, in the state where a predetermined level of positive voltage is applied to the drain area 2b to expand the depletion layer 12 in the channel area 3 as shown in FIG. 8A or 8B, a voltage +3 to +5 V higher than the voltage to be applied to the second control gate electrode 9 is applied to the first control gate electrode 7. Thus, hot electrons are implanted to the portion 5a (in FIG. 8A) or portion 5b (in FIG. 8B) of the floating gate electrode 5 located above the depletion layer 12 as indicated by the arrows "e". Very small amount of hot electrons are implanted also to the rest of the portion 5c excluding the portion 5a or the rest of the portion 5d excluding the portion 5b. However, since the amount of hot electrons implanted to the portion 5c or 5d is extremely small compared with that implanted to the portion 5a or 5b, it is negligible.

Since the gate oxide layer 8 having a sufficiently small thickness is located between the first control gate electrode 7 and the second control gate electrode 9, hot electrons having a relatively small energy (2 to 3 eV in this case) can be implanted into the floating gate electrode 5. In other words, although the difference in the voltage between the first control gate electrode 7 and the second control gate electrode 9 is relatively small (about +3 to +5 V in this case), a sufficient amount of hot electrons are implanted through the thin gate oxide layer 8 into the floating gate electrode 5.

The hot electrons having an energy of 2 to 3 eV have a relatively long average free path of 20 to 50 nm. Accordingly, the substances such as silicon and silicon oxide are scarcely damaged by the interaction between these substances and the hot electrons. In other words, the gate oxide layer 6 is hardly damaged when the hot electrons implanted into the floating gate electrode 5 penetrate the gate oxide layer 6.

Further, the gate electrode 5 has sufficiently large thickness (about 200 nm) compared with the average free path (20 to 50 nm) of hot electrons. Accordingly, the hot electrons implanted into the floating gate electrode 5 lose most of the energy in the floating gate electrode 5. Therefore, even if hot electrons should reach the gate oxide layer 4, they scarcely damage the gate oxide layer 4. In other words, the gate oxide layer 4 is scarcely damaged by hot electrons. Dependency of the average free path of electrons in a solid on energy is detailed in *Saishin Kotai Hyomen/Bisho-ryoiki no Kaiseki Hyoka Gijyutsu* (Latest Technology of Analyzing and Evaluating Solid Surfaces/Very Small Areas), p. 82 (published by Realize).

The higher the voltage (drain voltage) to be applied to the drain area 2b is, the larger becomes the depletion layer 12 expanding from the drain area 2b toward the source area 2a. When the drain voltage exceeds a predetermined value, the depletion layer 12 reaches the source area 2a.

Since the columnar crystals in the floating gate electrode 5 are electrically insulated from one another, the electrons are accumulated in the respective columnar crystals. Accordingly, the hot electrons implanted to the portion 5a or 5b of the floating gate electrode 5 are accumulated in the portion 5a or 5b only, but they do not leak to the portion 5c or 5d.

Next, the operation of writing four-value data "00", "01", "10" and "11" in the memory cell according to the first embodiment will be described. In the writing operation, a predetermined portion 5a or 5b in which a predetermined amount of hot electrons are implanted and accumulated is defined by controlling the width of the depletion layer 12. The portions 5a and 5b correspond to data values respectively.

Case 1: Operation of Writing the Data Value "00"

Figure 9A:
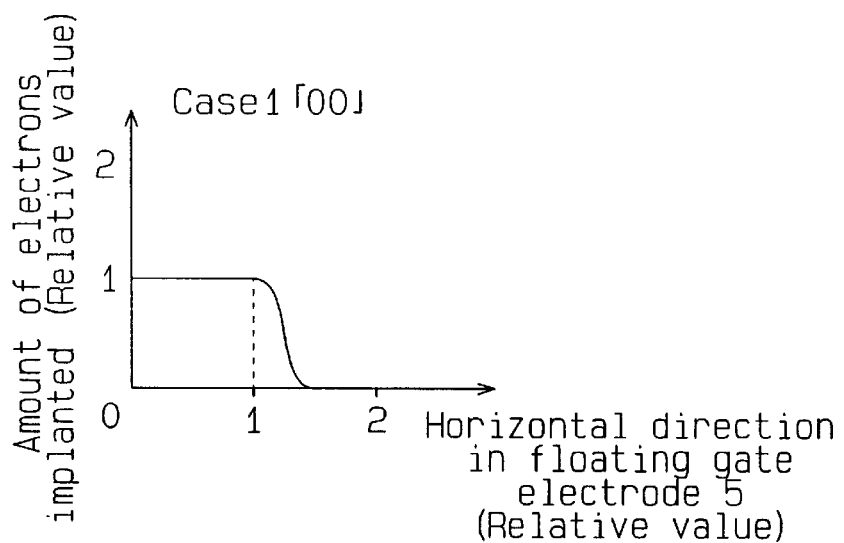
FIGS. 9A to 9D are graphs, each showing a relationship between electrons to be implanted into the floating gate electrode and the relative distance in the floating gate electrode for the operation of writing in the memory cell according to the first embodiment.

The drain voltage is adjusted such that the depletion layer 12 has a predetermined width W1, as shown in FIG. 8A. A predetermined level of voltage E1 higher than the voltage to be applied to the control gate electrode 9 is applied to the first control gate electrode 7 to implant hot electrons to the portion 5a of the floating gate electrode 5. FIG. 9A shows a graph illustrating the amount of electrons implanted to the floating gate electrode 5 in the operation of writing the data value "00". In this case, electrons are accumulated only in the portion 5a of the floating gate electrode 5, but not in the portion 5c excluding the portion 5a.

The x axis in each of the graphs shown in FIGS. 9A to 9D represents the horizontal direction in the floating gate electrode 5, provided that the extremity of the drain area 2b is the 0 point. This direction corresponds to the width of the depletion layer 12. As shown by these graphs, the larger the width of the depletion layer 12 is, the wider the portion to which electrons are implanted becomes and the longer the distance of such portion becomes. In other words, the larger the width of the depletion layer 12 becomes, the greater the amount of electrons to be implanted to the floating gate 5 in the horizontal direction becomes.

The y axis in each of the graphs shown in FIGS. 9A to 9D represents the amount of implanted electrons. The amount of implanted electrons corresponds not only to the difference in the potential between the first control gate electrode 7 and the second control gate electrode 9 but also to the voltage application time of the first control gate electrode 7 and that of the second control gate electrode 9. As shown in these graphs, the greater the difference in the potential or the longer the voltage application time is, the greater the amount of electrons implanted to the floating gate electrode 5 in the vertical direction becomes.

Case 2: Operation of Writing the Data Value "01"

Figure 9B:
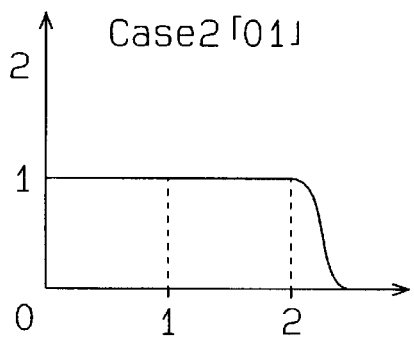
Figure 9C:
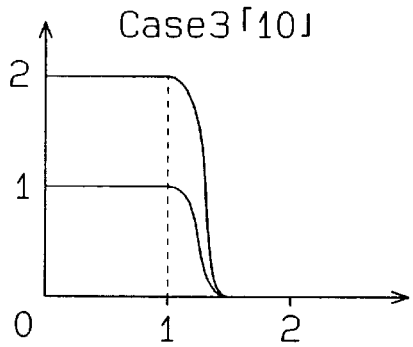

The drain voltage is adjusted such that the width of the depletion layer 12 is set at a predetermined value W2, which is greater than the predetermined value W1 (W2>W1), as shown in FIG. 8B. In this case, the predetermined value W2 is set to be twice as much as the predetermined value W1. A predetermined voltage E1 (the potential difference between the first control gate electrode 7 and the second control gate electrode 9) is applied to the first control gate electrode 7 to implant hot electrons into the portion 5b of the floating gate electrode 5. The portion 5b has a horizontal length of about twice that of the portion 5a. Consequently, as shown in FIG. 9B, the amount of hot electrons to be implanted to the portion 5b of the floating gate electrode 5 is twice that to be implanted in the portion 5a. In other words, the amount of hot electrons to be implanted to the floating gate electrode 5 is increased in the horizontal direction. In this case, the electrons are accumulated only in the portion 5b but not in the portion 5d excluding the portion 5b.

Case 3: Operation of Writing the Data Value "10"

The width of the depletion layer 12 is set to the predetermined value W1, as shown in FIG. 8A. The potential difference between the first control gate electrode 7 and the second control gate electrode 9 is set to the predetermined value E1 to implant hot electrons into the portion 5a of the floating gate electrode 5. Next, the width of the depletion layer 12 is set again to the predetermined value W1. The potential difference between the first control gate electrode 7 and the second control gate electrode 9 is set again to the predetermined value E1 to implant hot electrons to the portion 5a of the floating gate electrode 5. Thus, as shown in FIG. 9B, the amount of hot electrons implanted to the portion 5a of the floating gate electrode 5 is substantially twice that where the data value is "00". In other words, the amount of hot electrons implanted to the floating gate electrode is increased in the vertical direction. In this case, the electrons are accumulated in the portion 5a only but not in the portion 5c excluding the portion 5a.

Case 4: Operation of Writing the Data Value "11"

Figure 9D:
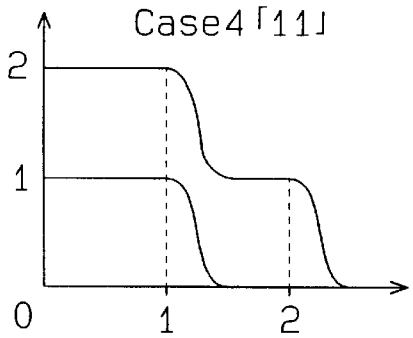

The width of the depletion layer 12 is set to the predetermined value W1, as shown in FIG. 8A. The potential difference between the first control gate electrode 7 and the second control gate electrode 9 is set to the predetermined value E1 to implant hot electrons into the portion 5a of the floating gate electrode 5. Next, the width of the depletion layer 12 is set to the predetermined value W2, as shown in FIG. 8B. The potential difference between the first control gate electrode 7 and the second control gate electrode 9 is set to the predetermined value E1 to implant hot electrons to the portion 5b of the floating gate electrode 5. Thus, as shown in FIG. 9D, the amount of hot electrons implanted to the portion corresponding to the portion 5a in the portion 5b is substantially twice that where the data value is "00". Further, the amount of hot electrons to be implanted to the remaining portion in the portion 5b excluding the portion 5a is substantially the same as that where the data value is "01". In other words, the amount of hot electrons implanted to the floating gate electrode 5 is increased in the vertical direction and in the horizontal direction. In this case, the electrons are accumulated in the portion 5b only but not in the portion 5d.

(b) Reading Operation

Cell current values corresponding to the multivalued data values are obtained by controlling the width of the depletion layer 12 and also controlling the potential of the first control gate electrode 7 and that of the second control gate electrode 9 in the reading operation.

1) Judgment of the Lower One Bit

Figure 10A:
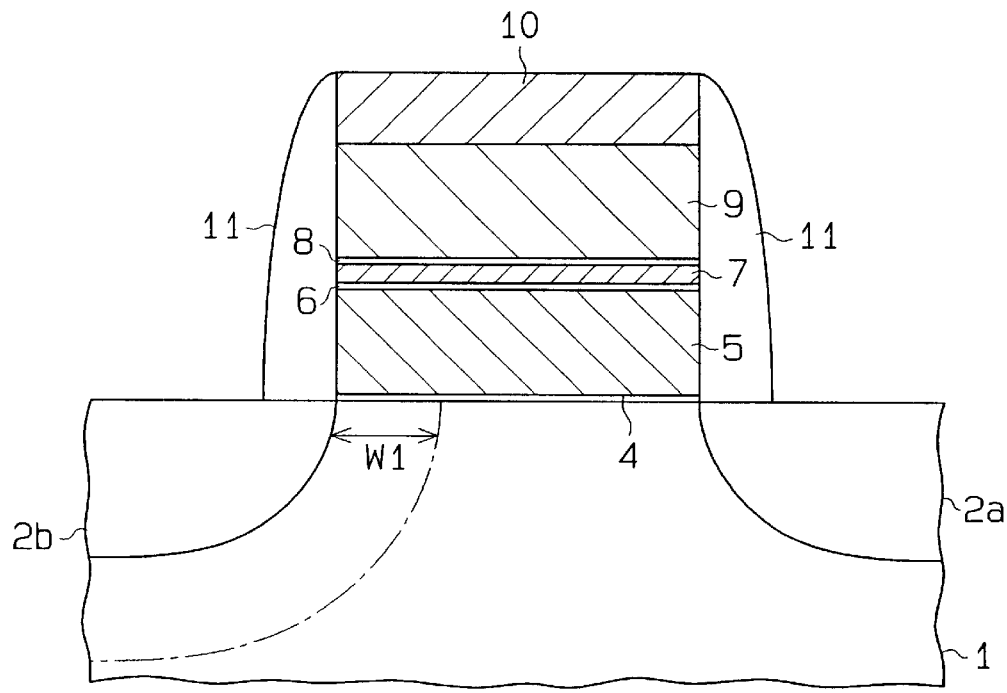
FIGS. 10A and 10B are schematic cross-sectional views showing operations of reading in the memory cell according to the first embodiment.

The drain voltage is adjusted such that the width of the depletion layer 12 is set to the predetermined value W1, as shown in FIG. 10A. A predetermined voltage E2 is applied to the first control gate electrode 7 and the second control gate electrode 9. The predetermined voltage E2 will be described later. In Case 1 (writing of the data value "00") and Case 3 (writing of the data value "10"), a cell current flows from the drain area 2b to the source area 2a. In Case 2 (writing of the data value "01") and in Case 4 (writing of the data value "11"), no cell current flows. Accordingly, either the data values "00" and "10" or the data values "01" and "11" is determined by judging presence or absence of cell current. In other words, it is determined whether the lower one bit of each data value is "0" or "1".

The reason that the cell current flows through the memory cell in which the data value "00" or "10" is written is as follows. In the state where the data value "00" or "10" is written, electrons are accumulated In the portion 5a only but not in the portion 5c. Accordingly, when the predetermined voltage E2 is applied, an OFF area defined under the portion 5a and an ON area defined under the portion 5c are present in the channel area 3. When the width of the depletion layer 12 is set to the predetermined value W1, the OFF area substantially coincides with the depletion layer 12, and only the ON area is present between the source area 2a and the drain area 2b. This ON area permits flow of the cell current from the drain area 2b to the source area 2a.

The reason that no cell current flows through the memory cell in which the data value "01" or "11" is written is as follows. In the state where the data value "01" or "11" is written, electrons are accumulated in the portion 5b only but not in the portion 5d. Accordingly, when the predetermined voltage E2 is applied, an OFF area defined under the portion 5b and an ON area defined under the portion 5d are present in the channel area 3. In this case, a portion of the OFF area overlaps with the depletion layer 12 having the predetermined width W1, and the rest of the OFF area excluding the overlapping portion does not overlap with the depletion layer 12. Accordingly, the rest of the OFF area and the ON area coexist between the source area 2a and the drain area 2b. Such coexistence inhibits flow of the cell current from the drain area 2b to the source area 2a.

Accordingly, in order to determine the lower one bit, the voltage E2 is set to a predetermined level, with the width of the depletion layer 12 being set to the predetermined value W1, such that a cell current may flow through the memory cell in which the data value "00" or "10" is written and such that no cell current may flow through the memory cell in which the data value "01" or "11" is written.

2) Determination of the Upper One Bit

Figure 10B:
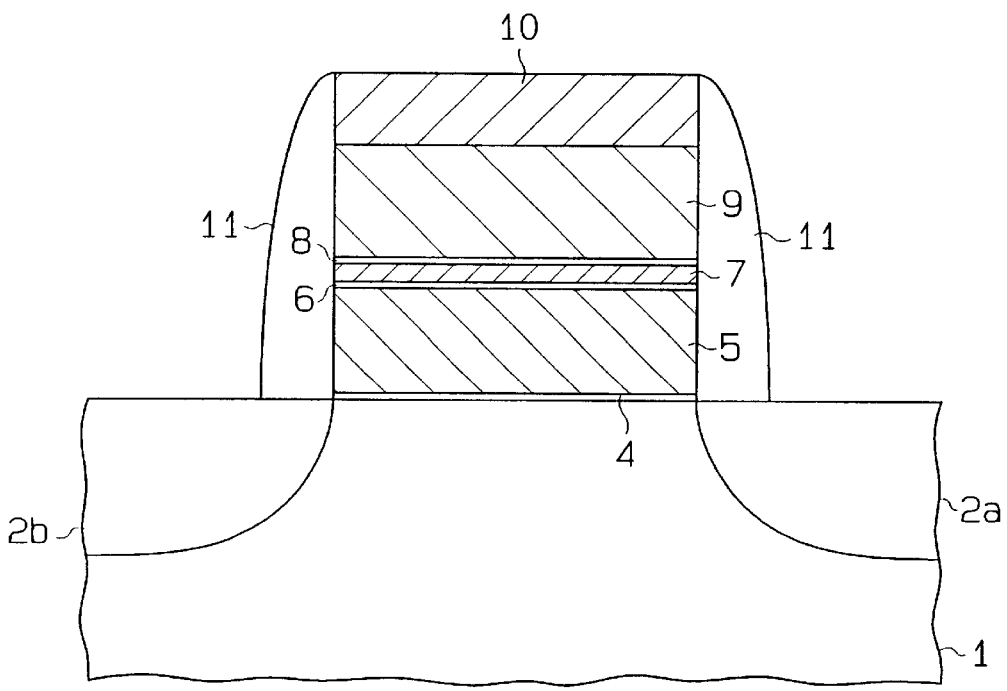

After the lower one bit is determined, the drain voltage is maintained at a level slightly larger than 0 V so that the width of the depletion layer 12 may be set smaller than the predetermined value W1, as shown in FIG. 10B. A predetermined voltage E3 is applied to the first and second control gate electrodes 7 and 9. The predetermined voltage E3 will be described later. In Case 1 and Case 2, a cell current flows, but no cell current flows in Case 3 and Case 4. Accordingly, either the data values "00" and "01" or the data values "10" and "11" is determined by judging presence or absence of cell current. In other words, it is determined whether the upper one bit of each data value is "0" or "1". As described above, two-bit data values can be read by judging first the lower one bit of each data value and then the upper one bit of that data value.

The reason that no cell current flows through the memory cell in which the data value "10" or "11" is written is as follows. In the state where the data value "10" or "11" is written, an OFF area defined under the portion 5a is present in the channel area 3, and electrons are accumulated in the portion 5a in an amount of about twice that in Case 1 (when data value is "00") and in Case2 (when data value is "01"). Accordingly, when a voltage equal or greater than the predetermined voltage E3 is applied, expansion of the depletion layer 12 is inhibited, and only the ON area is present in the channel area 3 of the memory cell in which the data value "00"or "01" is written to allow flow of cell current. Meanwhile, the OFF area is present in the channel area 3 of the memory cell in which the data value "10" or "11" is written, so that no cell current flows.

Accordingly, in order to judge the upper one bit, the voltage E3 is set to a predetermined level, with expansion of the depletion layer 12 being inhibited, such that a cell current may flow through the memory cell in which the data value "00" or "01" is written and such that no cell current may flow through the memory cell in which the data value "10" or "11" is written.

(c) Erasing Operation:

Hot holes are implanted to the floating gate electrode 5 in the erasing operation. Thus, the hot electrons accumulated in the floating gate electrode 5 in the writing operation are canceled by the hot holes implanted anew to erase the data stored in the memory cell. The implantation of hot holes may be achieved by allowing an FN tunnel current to flow from the first control gate electrode 7 to the floating gate electrode 5. More specifically, a voltage 0 V is applied to the source area 2a and to the drain area 2b, and a voltage about +5 V lower than the potential to be applied to the second control gate electrode 9 is applied to the first control gate electrode 7. The gate oxide layer 8 having a sufficiently small film thickness permits implantation of hot holes having a relatively small energy (2 to 3 eV in this case) into the floating gate electrode 5. In other words, although the difference in the potential between the first control electrode 7 and the second control electrode 9 is relatively small (5 V in this case), a sufficient amount of hot holes are allowed to be implanted into the floating gate electrode 5.

The hot holes having an energy of 2 to 3 eV also have relatively long average free path like the hot electrons, Accordingly, the hot holes scarcely damage to the gate oxide layer 6. The floating gate electrode 5 has a sufficiently large film thickness compared with the average free path of the hot holes. Accordingly, the hot holes lose most of the energy in the floating gate electrode 5. Therefore, even if the hot holes should reach the gate oxide layer 4, the gate oxide layer 4 is scarcely damaged. In other words, the gate oxide layer 4 is scarcely damaged by hot holes.

In the erasing operation, both the source area 2a and the drain area 2b may be allowed to assume open states, and a voltage of +15 V may be applied to the first and second control gate electrodes 7 and 9. Thus, an FN tunnel current flows from the first and second control gate electrodes 7, 9 toward the floating gate electrode 5. Consequently, the hot electrons are extracted from the floating gate electrode 5 through the gate oxide layer 6 into the first and second control gate electrodes 7 and 9, and thus the data stored in the memory cell are erased.

In the first embodiment, hot holes may be implanted to the floating gate electrode 5 in the writing operation, and hot electrons may be implanted into the floating gate electrode 5 in the erasing operation. In this case, the single crystal silicon substrate 1, the source area 2a and the drain area 2b each have P-type conductivity. Since implantation of hot holes into the floating gate electrode 5 can be achieved relatively easily, the writing operation is facilitated. A predetermined value of negative voltage is applied to the drain area 2b so as to expand the depletion layer 12.

The layers 4 to 9 are each designed to have a film thickness as described below.

Gate oxide layer 4: The film thickness of the gate oxide layer 4 is suitably 5 to 15 nm, desirably 8 to 12 nm. A film thickness greater than the specified range causes excessive increase in the threshold voltage VTnomal and further increases power consumption. A film thickness smaller than the specified range readily allows leakage of hot carriers from the floating gate electrode 5 through the gate oxide layer 4 to shorten the retention time of the data stored in the memory cell.

Floating gate electrode 5: The film thickness of the floating gate electrode 5 is suitably 50 to 500 nm. A film thickness greater than the specified range inhibits flattening of the surface of a device having a structure formed over the memory cell. A film thickness smaller than the specified range allows the hot carriers to reach the gate oxide layer 4 and damage it.

Gate oxide layer 6: The film thickness of the gate oxide layer 6 is suitably 5 to 15 nm. A film thickness greater then the specified range increases the hot carrier implantation energy. This increases the damage to the gate oxide layer 6 when the hot carriers penetrate it. Further, the hot carriers reach the gate oxide layer 4 and possibly damage the gate oxide layer 4. A film thickness smaller than the specified range readily permits leakage of the hot carriers from the floating gate electrode 5 through the oxide layer 6 to shorten the retention time of the data stored in the memory cell.

First control gate electrode 7: The film thickness of the first control gate electrode 7 is suitably 10 to 100 nm, desirably 10 to 30 nm. A film thickness greater than the specified range reduces the amount of hot carriers to be implanted to the floating gate electrode 5. A film thickness smaller than the specified range increases electrical resistance of the first control gate electrode 7.

Gate oxide layer 8: The film thickness of the gate oxide layer 8 is suitably 1 to 5 nm, desirably 2 to 3 nm. A film thickness greater than the specified range increases the hot carrier implantation energy. This possibly increase damage to the gate oxide layers 6 and 8 when the hot carriers penetrate them and also damages to the gate oxide layer 4. A film thickness smaller than the specified range readily allows energization of the first and second control electrodes 7 and 9 and thus makes it difficult to achieve a desired difference in the potential between these electrodes 7 and 9.

Second control gate electrode 9: The film thickness of the second control gate electrode is suitably 50 to 500 nm, desirably 100 to 200 nm. A film thickness greater than the specified range inhibits flattening of the surface of the device having a structure formed over the memory cell. A film thickness smaller than the specified range increases the electrical resistance of the control gate electrode 9.

Second Embodiment

A second embodiment according to the present invention will be described referring to the attached drawings. To avoid a redundant description, like or sane reference numbers are given to those components that are like or the same as corresponding components of the first embodiment.

Figure 11:
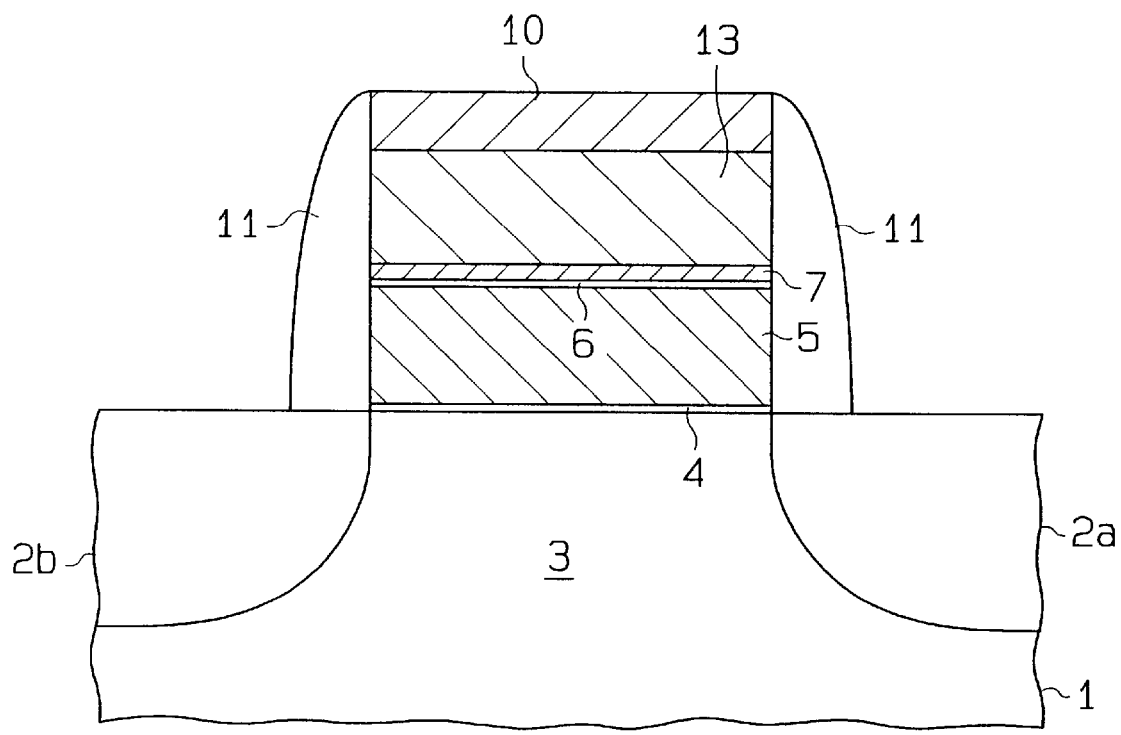
FIG. 11 is a schematic cross-sectional view showing a memory cell of a non-volatile semiconductor memory device according to a second embodiment of the invention.

As shown in FIG. 11, the memory cell according to the second embodiment is different from that of the first embodiment in the structure of the gate electrode. The memory cell of the second embodiment has a gate oxide layer 4 (film thickness: about 10 nm), a floating gate electrode 5 (film thickness: about 200 nm), a gate oxide layer 6 (film thickness: about 10 nm), a polysilicon first control gate electrode 7 (film thickness: about 20 nm), a metallic second control gate electrode 13 (film thickness: about 200 nm) and an insulating layer 10 (film thickness: about 100 nm), which are laminated successively on the surface of a channel area 3 in that order. While the layers 4 to 7, 13 and 10 have different film thicknesses, they all have the same dimensions in the horizontal directions. The layers 4 to 7, 13 and 10 each have a substantially uniform film thickness. The film thickness of the second control gate electrode 13 is preferably 100 to 500 nm. The source area 2a and the drain area 2b are arranged symmetrically on each side of the gate electrodes 5, 7 and 13 and channel area 3.

The polysilicon first control gate electrode 7 and the metallic second control gate electrode 13 constitute a Schottky junction. In order to enable external setting of voltages to be applied to the first and second control gate electrodes 7 and 13, the first and second control gate electrodes 7 and 13 are connected to wirings (not shown) respectively. The first control gate electrode 7 may be formed using other conductive materials such as silicon carbide in place of polysilicon.

Figure 12A:
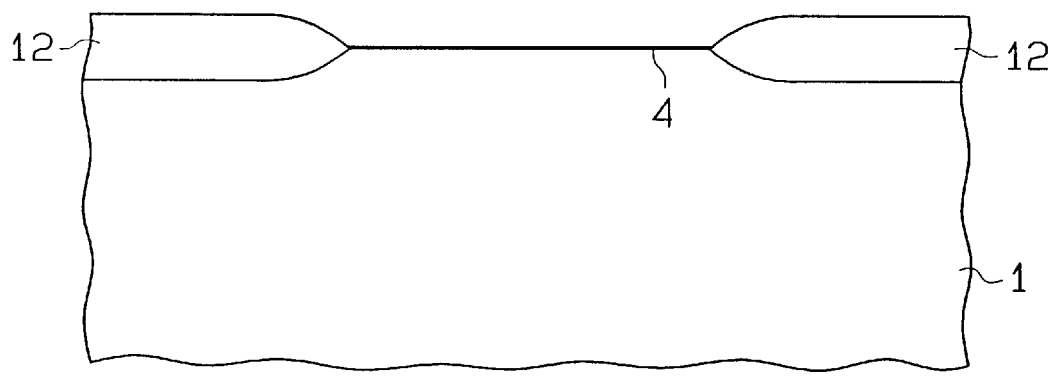
FIGS. 12A to 12C are schematic cross-sectional views showing a process for producing the memory cell shown in FIG. 11.

A process for producing the memory cell according to the second embodiment will be described step by step, Step 1 (see FIG. 12A):

A field oxide film 12 is formed partially on the surface of a p-type single crystal silicon substrate 1 according to the LOCOS process in the same manner as in Step 1 (see FIG. 5A) of the first embodiment. Next, a gate oxide film 4 is formed in the same manner as in the first embodiment.

Figure 12B:
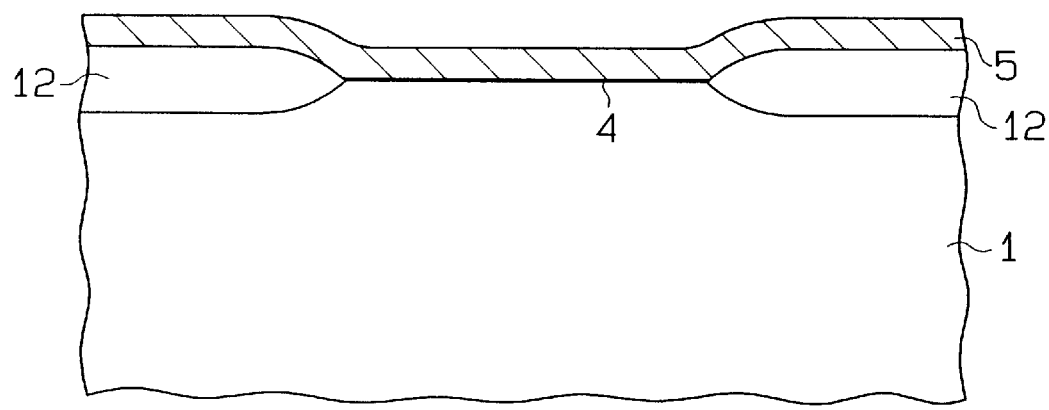

Step 2 (see FIG. 12B):

A film 5 for forming a floating gate electrode is formed on the surfaces of the field oxide film 12 and of the gate oxide film 4 in the same manner as in Step 2 (see FIG. 5B) of the first embodiment.

Figure 12C:
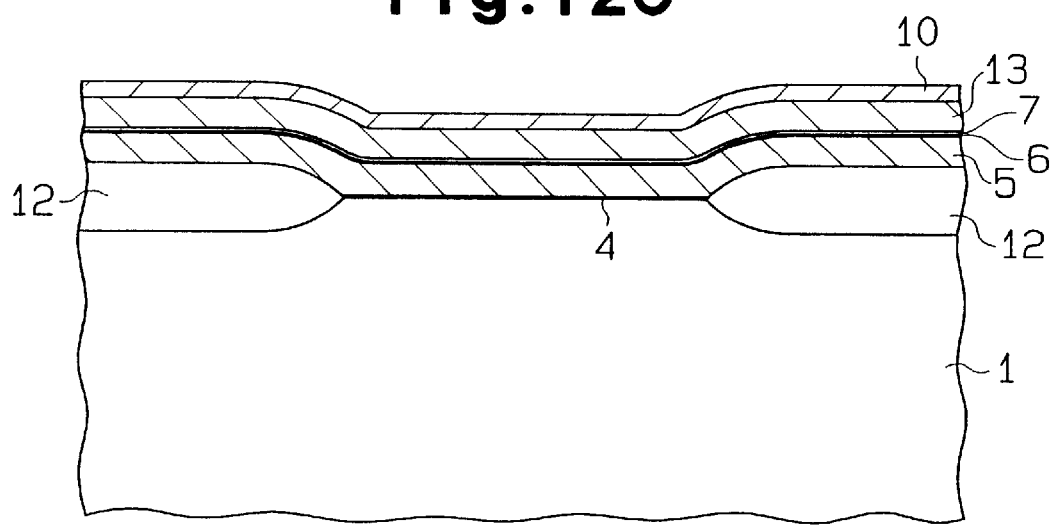

Step 3 (see FIG. 12C):

A doped polysilicon film 6 for forming a gate oxide film is formed on the surface of the film 5, and then a doped polysilicon film 7 for forming a first control gate electrode is formed thereon, by means of CVD. A metallic film 13 for forming a second control gate electrode is formed on the surface of the doped polysilicon film 7 by means of PVD (Physical Vapor Deposition). Aluminum, tungsten, titanium, titanium nitride may be employed for the metallic film. The metallic film 13 may be formed by means of CVD. For example, when tungsten is employed for forming the metallic film 13, formation of the metallic film 13 is achieved by means of tungsten CVD. In this case, the films 4 to 10 can be formed successively using the same CVD apparatus. Subsequently, a silicon oxide film 10 serving as an insulating film is then formed on the surface of the metallic film 13. The doped polysilicon film and the first control gate electrode are affixed with the same reference number 7; while the metallic film and the second control gate electrode are affixed with the same reference number 13.

Figure 13:
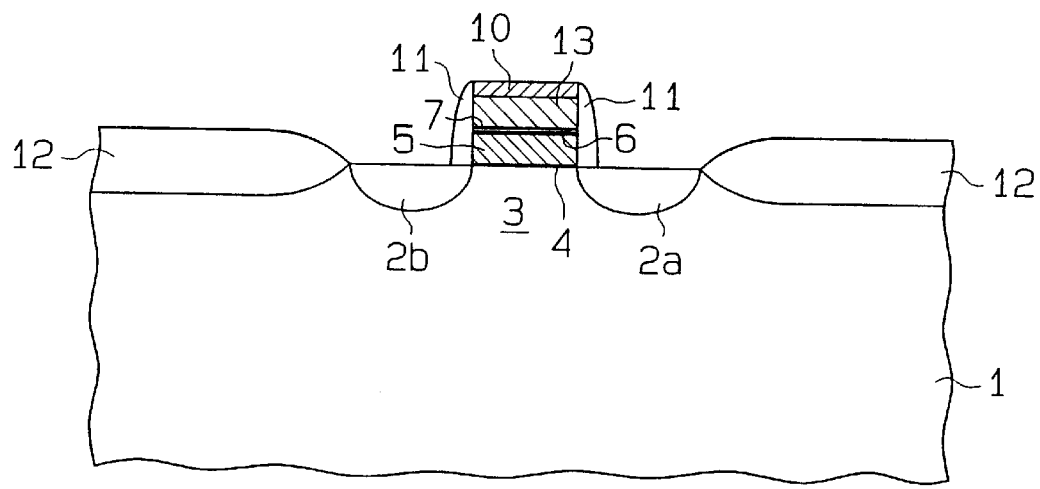
FIG. 13 is a schematic cross-sectional view showing a process for producing the memory cell shown in FIG. 11.

Step 4 (see FIG. 13):

The films 4 to 7, 13 and 10 are subjected to patterning by means of anisotropic etching to define a gate oxide layer 4, a floating gate electrode 5, a gate oxide layer 6, a first control gate electrode 7, a second control gate electrode 13 and an insulating layer 10. Since the same procedures as in the first embodiment follow, a description of them has been omitted.

Next, operations of the memory cell according to the second embodiment (writing operation, reading operation and erasing operation) will be described.

Writing Operation:

In the state where a predetermined level of voltage is applied to the drain area 2b to expand the depletion layer 12 in the channel area 3, a voltage +3 to +5 V higher than the voltage to be applied to the second control gate electrode 13 is applied to the first control gate electrode 7. The Schottky junction formed by the first and second control gate electrodes 7 and 13 is useful for controlling the implantation energy of hot electrons to be implanted to the floating gate electrode 5. More specifically, like in the first-embodiment, hot electrons having a relatively low energy (2 to 3 eV in this case) can be implanted to the floating gate electrode 5. In other words, the energy of hot electrons are controlled by setting the voltages to be applied to the first and second-control gate electrodes 7 and 13 to predetermined values. Accordingly, the gate oxide layers 4 and 6 are scarcely damaged by hot electrons in the second embodiment.

Reading Operation:

Since the reading operation is the same as in the first embodiment, a description of it has been omitted.

Erasing Operation:

A voltage 0 V is applied to the source area 2a and to the drain area 2b, and a voltage about +5 V lower than the potential to be applied to the second control gate electrode 13 is applied to the first control gate electrode 7. In this case, the schottky junction formed by the first and second control gate electrodes 7 and 13 enables implantation of hot holes having a relatively low implantation energy (2 to 3 ev in this case) into the floating gate electrode 5. In other words, the energy of hot holes can be controlled by setting the potentials to be applied to the first and second control gate electrodes 7 and 13 to predetermined values. Accordingly, the gate oxide layers 4 and 6 are scarcely damaged by hot holes in the second embodiment.

Third Embodiment

A third embodiment of the present invention will be described below. To avoid a redundant description, like or same reference numbers are given to those components that are like or the same as the corresponding components of the first embodiment.

Figure 14:
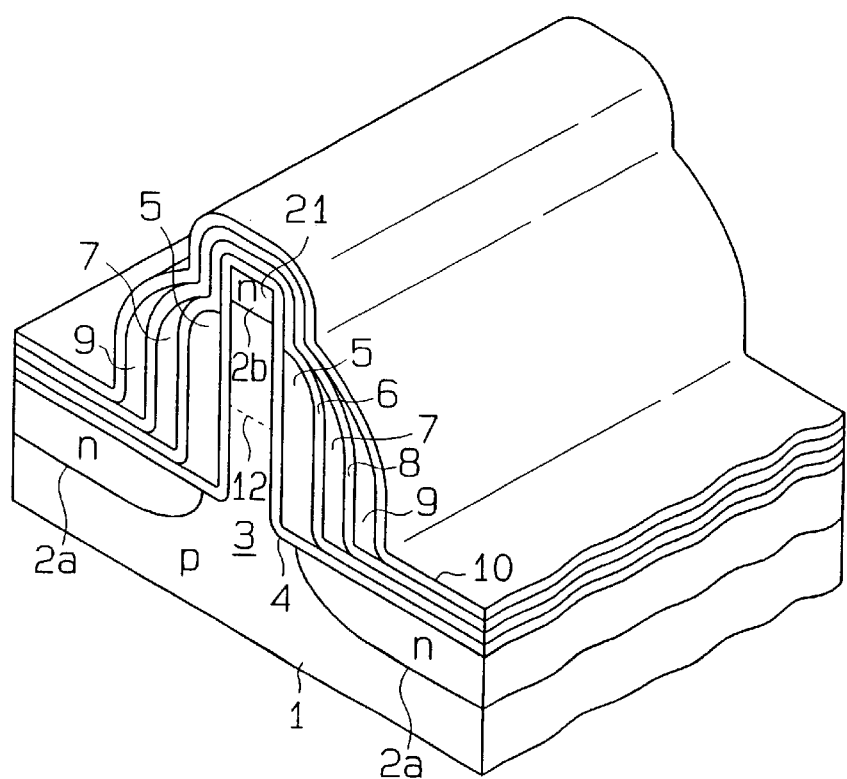
FIG. 14 is a schematic perspective view showing a memory cell of a non-volatile semiconductor memory device according to a third embodiment of the invention.

As shown in FIG. 14, the memory cell according to the third embodiment has a p-type single crystal silicon substrate 1 and a pillar 21 formed on the surface of the substrate 1 integrally therewith in terms of the crystal structure. The pillar 21 is formed to extend perpendicular from the silicon substrate 1 and has a width of about 0.2 $\mu$m. The pillar 21 has two side walls and an upper end face. The pillar 21 may be formed by subjecting the substrate 1 to anisotropic etching or by allowing single crystal silicon to grow on the substrate 1.

The pillar 21 includes an n-type drain area 2b defined at the upper portion and a channel area 3 defined at the intermediate portion and the bottom portion. A couple of n-type source areas 2a are defined on the surface of the substrate 1 symmetrically on each side of the pillar 21.

The memory cell further has a gate oxide layer 4 (film thickness: about 10 nm), a gate oxide layer 6 (film thickness: about 10 nm), a gate oxide layer 8 (film thickness: about 3 nm) and an insulating layer 10 (film thickness: about 100 nm) laminated successively on the surfaces of the side walls and the top of the pillar 21 and on the surface of the p-type single crystal silicon substrate 1 in this order. On the respective sides of the side walls of the pillar 21, a pair of floating gate electrodes 5 (film thickness: about 200 nm) are located between the gate insulating layer 4 and the gate oxide layer 6. Likewise, a pair of first control gate electrodes 7 (film thickness: about 20 nm) are located between the gate insulating layer 6 and the gate oxide layer 8, while a pair of second control gate electrodes 9 (film thickness; about 200 nm) are located between the gate insulating layer 8 and the insulating layer 10.

Each floating gate electrode 5 includes columnar conductive microcrystals (columnar crystals) oriented to extend in a direction perpendicular to the surfaces of the side wall of the pillar 21 and the surface of the gate oxide film 4. The columnar crystals have very small gaps therebetween, and these gaps are packed with an insulating material. Thus, the adjoining columnar crystals are electrically insulated from one another. The electrodes 5, 7 and 9 may be formed according to the method of forming side wall spacers. Operations of the memory cell (writing, reading and erasing operations) according to the third embodiment having the constitution described above are the same as those of the memory cell of the first embodiment.

In the third embodiment, since a depletion layer 12 having a relatively small width is formed along the pillar 21, the depletion layer 12 has a linear width with respect to the drain voltage. This further enables accurate control of the width of the depletion layer 12 and of the length of the portion of the floating gate electrode 5 to which electrons are implanted. The channel area 3 defined in the pillar 21 reduces the parasitic capacitance including the junction capacitance. This enables high-speed operation of the memory device. Further, the channel area 3 secured in the pillar 21 facilitates separation of elements between the memory cells. The integration of the pillar 21 with the substrate 1 controls occurrence of substrate floating effect, which gives rise to a problem in the SOI structure. The gate electrodes 5, 7 and 9 are formed separately on each side of the pillar 21. This structure enables one memory cell to perform two operations: one operation employing the gate electrodes 5, 7 and 9 on one side of the pillar 21 and another operation employing the gate electrodes 5, 7 and 9 on the other side of the pillar 21, respectively, These operations enhance the memory sell integration efficiency.

Fourth Embodiment

A fourth embodiment of the present invention will be described below. To avoid a redundant description, like or same reference numbers are given to those components that are like or the same as corresponding components of the third embodiments.

Figure 15:
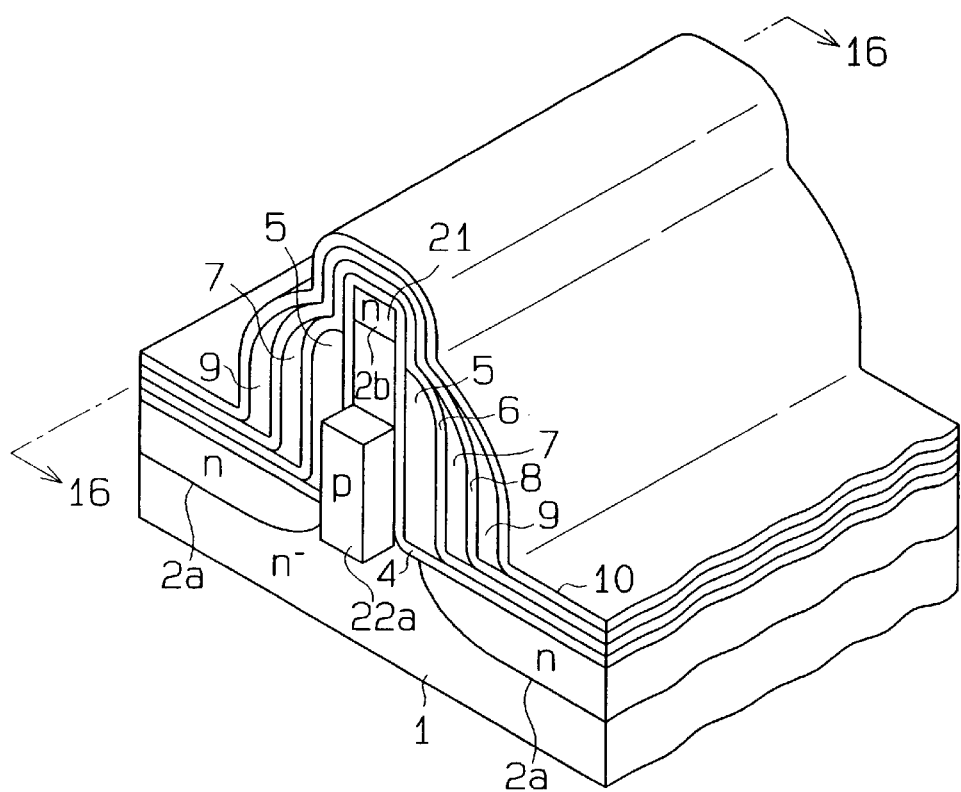
FIG. 15 is a schematic perspective view showing a memory cell of a non-volatile semiconductor memory device according to a fourth embodiment of the invention.
Figure 16:
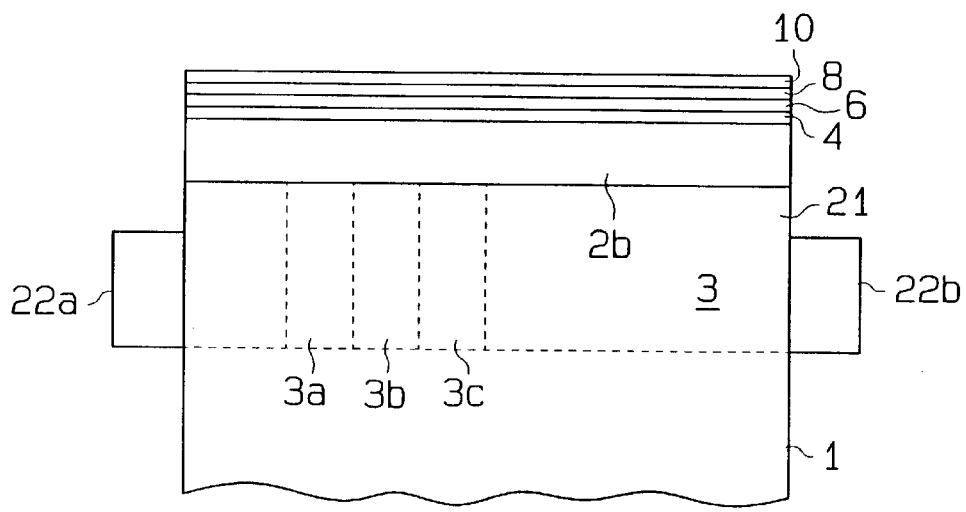
FIG. 16 is a schematic cross-sectional view of the memory cell shown in FIG. 15 taken along the line 16—16.

As shown in FIGS. 15 and 16, the memory cell according to the fourth embodiment is different from the third embodiment in the following aspects.

(1) The pillar 21 has two end faces, and electrodes 22a and 22b are partly formed on these end faces where the channel area 3 is defined, respectively;

(2) Both the substrate 1 and the pillar 21 have n-type conductivity; and (3) When the electrodes 22a and 22b are formed of silicon, these electrodes 22a and 22b are doped with a p-type impurity. Thus, the electrodes 22a and 22b constitute a p-n junction with the surrounding n-type semiconductor.

In the memory cell according to the fourth embodiment, predetermined negative voltages are applied to the electrodes 22a and 22b. Thus, as shown in FIG. 16, one section 3a is selected from a plurality of sections defined in the channel area 3. The thus selected section 3a is used for performing the writing operation and reading operation. In other words, electrons are implanted to the portion of the floating gate electrode 5 corresponding to the portion 3a and accumulated there, and thus binary data are stored in the memory cell.

The plurality of sections 3a to 3c in the channel area 3 are selected successively, and electrons are implanted and accumulated to the corresponding portions of the floating gate electrode 5. Thus, binary data are successively stored. For example, it three portions 3a to 3c are employed, 8 ($2^3$)-value data is stored by storing binary data in the portions 3a to 3c successively. The hot carriers (hot electrons or hot holes) are implanted to the floating gate electrode 5 in the same manner as in the first embodiment.

Fifth Embodiment

A fifth embodiment of the present invention will be described below. To avoid a redundant description, like or same reference numbers are given to those components that are like or the same as corresponding components of the first and fourth embodiments.

Figure 17:
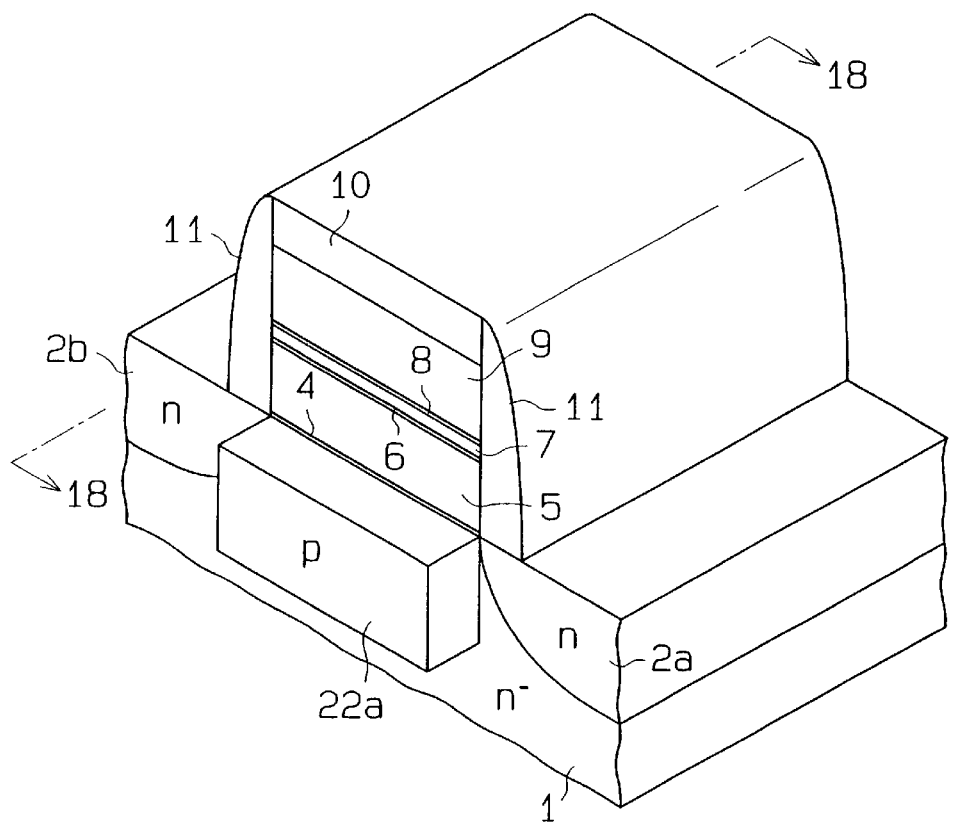
FIG. 17 is a schematic perspective view showing a memory cell of a non-volatile semiconductor memory device according to a fifth embodiment of the invention.
Figure 18:
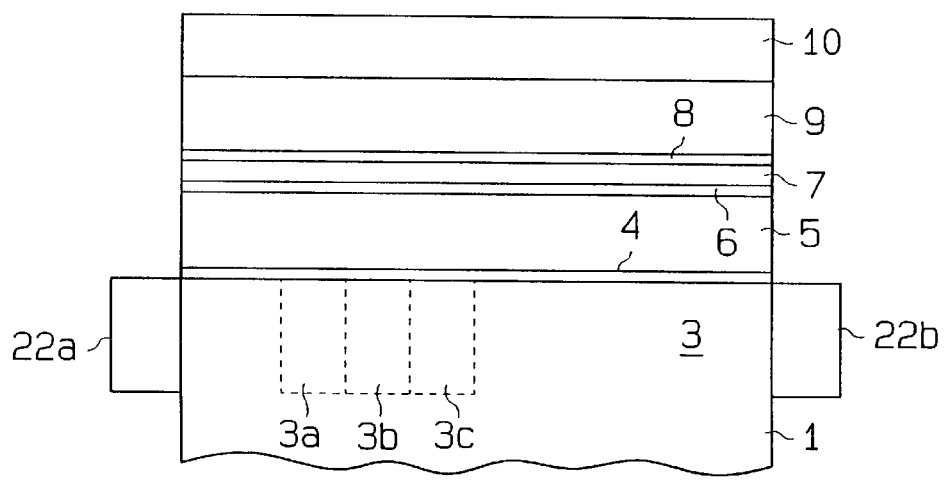
FIG. 18 is a schematic cross-sectional view of the memory cell shown in FIG. 17 taken along the line 18—18.

As shown in FIGS. 17 and 18, the memory cell of the fifth embodiment consists of a combination of the first embodiment and the fourth embodiment. In the memory cell of the first embodiment, the n-type substrate 1 has two end faces, and a pair of p-type electrodes 22a and 22b are partly formed on these end faces where the channel area 3 is defined.

Although several embodiments of the present invention have been described herein, it should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. A non-volatile semiconductor memory device for storing multivalue data, comprising:

a semiconductor layer;

a source area and a drain area, which are defined on the semiconductor layer, with a channel area being defined between said source area and said drain area;

a first gate insulating layer located on said channel area;

a floating gate electrode located on said first gate insulating layer;

a second gate insulating layer located on said floating gate electrode; and at least one control gate electrode located on said second gate insulating layer;

wherein said floating gate electrode is configured to include at least a first portion and a second portion, said first portion is employed for accumulating carriers that migrate through said second gate insulating layer to said floating gate electrode, said first portion has a predetermined width, which is adjustable, and the multivalue data is stored in said first portion by adjusting the predetermined width of said first portion and the amount of hot carriers to be accumulated in said first portion.

2. The device according to claim 1, wherein the carriers have a relatively small energy.

3. The device according to claim 1, wherein said channel area includes a depletion layer having an adjustable predetermined width and said first portion has a width substantially equal to that of the depletion layer.

4. The device according to claim 1, wherein said floating gate electrode includes a plurality of columnar conductive mircrocrystals oriented to extend in a direction perpendicular to said first gate insulating layer, wherein adjoining microcrystals are insulated from one another.

5. The device according to claim 4, wherein a group of microcrystals included in said first portion and a group of microcrystals included in second portion are insulated from each other.

6. The device according to claim 1, wherein said first portion is employed for implanting hot carriers having a first conductivity and migrating from said at least one control gate electrode through said second gate insulating layer in a data writing operation.

7. The device according to claim 6, wherein said first portion is employed for implanting hot carriers having a second conductivity and migrating from said at least one control gate electrode through said second gate insulating layer in a data erasing operation.

8. The device according to claim 1, wherein said semiconductor layer has two end faces, the non-volatile semiconductor memory device further comprising two electrodes located partly on said end faces where said channel area is defined.

9. A non-volatile semiconductor memory device for storing multivalue data, comprising:

a semiconductor layer;

a source area and a drain area, which are defined on the semiconductor layer, with a channel area being defined between said source area and said drain area;

a first gate insulating layer located on said channel area;

a floating gate electrode located on said first gate insulating layer;

a second gate insulating layer located on said floating gate electrode;

a first control gate electrode located on said second gate insulating layer;

a third gate insulating layer located on said first control gate electrode; and a second control gate electrode located on said third gate insulating layer;

wherein said floating gate electrode is configured to include at least a first portion and a second portion, said first and second control gate electrodes are employed for generating hot carriers that migrate through said second gate insulating layer to said floating gate electrode, said hot carriers having a relatively small energy and being generated by applying a predetermined voltage to said first and second control gate electrodes, said first portion is employed for accumulating said to carriers, said first portion has a predetermined width, which is adjustable, and the multivalue data is stored in said first portion by adjusting the predetermined width of said first portion and the amount of hot carriers to be accumulated in said first portion.

10. The device according to claim 9, wherein said channel area includes a depletion layer having an adjustable predetermined width and said first portion has a width substantially equal to that of the depletion layer.

11. The device according to claim 9, wherein said floating gate electrode includes a plurality of columnar conductive microcrystals oriented to extend in a direction perpendicular to said first gate insulating layer, wherein adjoining microcrystals are insulated from one another.

12. The device according to claim 11, wherein a first group of said microcrystals is included in said first portion and a second group of said microcrystals is included in said second portion.

13. The device according to claim 9, wherein said first portion is employed for implanting hot carriers having a first conductivity and migrating from said first control gate electrode through said second gate insulating layer in a data writing operation.

14. The device according to claim 13, wherein said first portion is employed for implanting hot carriers having a second conductivity and migrating from said first control gate electrode through said second gate insulating layer in a data erasing operation.

15. The device according to claim 9, wherein said semiconductor layer has two end faces, the non-volatile semiconductor memory device further comprising two electrodes located partly on said end faces where said channel area is defined.

16. A non-volatile semiconductor memory device, comprising:

a semiconductor layer;

a source area and a drain area, which are defined on the semiconductor layer, with a channel area being defined between said source area and said drain area;

a first gate insulating layer located on said channel area;

a floating gate electrode located on said first gate insulating layer;

a second gate insulating layer located on said floating gate electrode;

a semiconductor gate electrode located on said second gate insulating layer; and a metallic gate electrode located on said semiconductor gate electrode;

wherein said floating gate electrode is configured to include at least a first portion and a second portion, said semiconductor and metallic gate electrodes are employed for generating hot carriers that migrate through said second gate insulating layer to said floating gate electrode, said hot carriers having a relatively small energy and being generated by applying a predetermined voltage to said semiconductor and metallic gate electrodes, and said first portion is employed for accumulating said hot carriers, and wherein the amount of hot carriers to be accumulated in said first portion is adjusted depending on a data value.

17. The device according to claim 16, wherein said first portion has a predetermined width, which is adjustable.

18. The device according to claim 17, wherein said data is multivalue data.

19. The device according to claim 16, wherein said channel area includes a depletion layer having an adjustable predetermined width and said first portion has a width substantially equal to that of the depletion layer.

20. The device according to claim 16, wherein said floating gate electrode includes a plurality of columnar conductive microcrystals oriented to extend in a direction perpendicular to said first gate insulating layer, wherein adjoining microcrystals are insulated from one another.

21. The device according to claim 20, wherein a first group of said microcrystals is included in said first portion and a second group of said microcrystals is included in said second portion.

22. The device according to claim 16, wherein said first portion is employed for implanting hot carriers having a first conductivity and migrating from said semiconductor gate electrode through said second gate insulating layer in a data writing operation.

23. The device according to claim 22, wherein said first portion is employed for implanting hot carriers having a second conductivity and migrating from said semiconductor gate electrode through said second gate insulating layer in a data erasing operation.

24. The device according to claim 16, where said semiconductor and metallic gate electrodes comprise a Schottky junction.

25. The device according to claim 24, said semiconductor gate electrode is made of polysilicon.

26. A non-volatile semiconductor memory device, comprising:

a semiconductor layer having a first conductivity;

two first semiconductor areas defined on the semiconductor layer and having a second conductivity;

a pillar formed over the channel area and extending perpendicular from said semiconductor layer, said pillar including two side walls and a second semiconductor area defined at an upper portion of said pillar, said second semiconductor area having the second conductivity;

two first gate insulating layers respectively located on the two walls of said pillar;

two floating gate electrodes respectively located on said two first gate insulating layers, each of said floating gate electrodes configured to be divided into a first portion and a second portion;

two second gate insulating layers respectively located on said two floating gate electrodes;

two first control gate electrodes respectively located on said two second gate insulating layers;

two third gate insulating layers respectively located on said two first control gate electrodes; and two second control gate electrodes respectively located on said two third gate insulating layers;

wherein said first and second control gate electrodes on one side wall of said pillar and said first and second control gate electrodes on the other side wall of said pillar are employed for generating hot carriers that respectively migrate from said first control gate electrode through the second gate insulating layer to said floating gate electrode, said hot carriers having a relatively small energy and being generated by applying a predetermined voltage to said respective first and second control gate electrodes, wherein said first portion of each of said floating gate electrodes is employed for accumulating said hot carriers, and wherein the amount of hot carriers to be accumulated in said first portion is adjusted depending on a data value.

27. The device according to claim 26, wherein said first portion of said floating gate electrodes has a predetermined width, which is adjustable.

28. The device according to claim 27, wherein said data is multivalue data.

29. The device according to claim 26, wherein said channel area includes a depletion layer having an adjustable predetermined width, and wherein said first portion of said floating gate electrodes has a width substantially equal to that of the depletion layer in said channel area.

30. The device according to claim 26, wherein each of said floating gate electrodes includes a plurality of columnar conductive microcrystals oriented to extend in a direction perpendicular to an associated one of said first gate insulating layers, wherein adjoining microcrystals are insulated from one another.

31. The device according to claim 30, wherein a first group of said microcrystals is included in said first portion of each of said floating gate electrodes and a second group of said microcrystals is included in said second portion of each of said floating gate electrodes.

32. The device according to claim 26, wherein said first portion of each of said floating gate electrodes is employed for implanting hot carriers that migrate from said first control gate electrodes through said second gate insulating layers in a data writing operation.

33. The device according to claim 26, wherein said first portion of each of said floating gate electrodes is employed for implanting hot carriers that migrate from said first control gate electrodes through said second gate insulating layers in a data erasing operation.

34. The device according to claim 26, wherein said pillar has two end faces, the non-volatile semiconductor memory device further comprising two electrodes located partly on said end faces where said channel area is defined.

* * * * *